(12) United States Patent
Takaoka

(10) Patent No.: US 10,249,751 B2
(45) Date of Patent: Apr. 2, 2019

(54) HIGH-SPEED DIODE WITH CRYSTAL DEFECTS AND METHOD OF MANUFACTURING

(71) Applicant: ROHM CO., LTD., Kyoto-shi, Kyoto (JP)

(72) Inventor: Jun Takaoka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/597,556

(22) Filed: May 17, 2017

(65) Prior Publication Data

US 2017/0338335 A1 Nov. 23, 2017

(30) Foreign Application Priority Data

May 19, 2016 (JP) .................. 2016-100861

(51) Int. Cl.
| H01L 29/861 | (2006.01) |
| H01L 29/78 | (2006.01) |
| H01L 29/06 | (2006.01) |
| H01L 29/66 | (2006.01) |
| H01L 29/167 | (2006.01) |
| H01L 29/32 | (2006.01) |
| H01L 29/40 | (2006.01) |
| H01L 29/16 | (2006.01) |
| H01L 29/36 | (2006.01) |

(52) U.S. Cl.
CPC ...... *H01L 29/7806* (2013.01); *H01L 29/0615* (2013.01); *H01L 29/0619* (2013.01); *H01L 29/0638* (2013.01); *H01L 29/0684* (2013.01); *H01L 29/167* (2013.01); *H01L 29/1608* (2013.01); *H01L 29/32* (2013.01); *H01L 29/404* (2013.01); *H01L 29/66128* (2013.01); *H01L 29/66143* (2013.01); *H01L 29/861* (2013.01); *H01L 29/8611* (2013.01); *H01L 29/36* (2013.01); *H01L 29/7805* (2013.01)

(58) Field of Classification Search
CPC ............... H01L 29/7806; H01L 29/167; H01L 29/66143; H01L 29/861; H01L 29/36; H01L 29/0684
See application file for complete search history.

(56) References Cited

U.S. PATENT DOCUMENTS

| 8,921,889 B2 * | 12/2014 | Bamba .................. H01L 29/04 257/140 |
| 2007/0145414 A1 | 6/2007 | Francis et al. |

(Continued)

FOREIGN PATENT DOCUMENTS

| JP | H08186277 A | 7/1996 |
| JP | H10200132 A | 7/1998 |

(Continued)

*Primary Examiner* — Bilkis Jahan
(74) *Attorney, Agent, or Firm* — Hamre, Schumann, Mueller & Larson, P.C.

(57) ABSTRACT

A high-speed diode includes an n-type semiconductor layer and a p-type semiconductor layer which is laminated on the n-type semiconductor layer, where a pn junction is formed in a boundary portion between the n-type semiconductor layer and the p-type semiconductor layer, and crystal defects are formed such that the frequency of appearance is gradually decreased from the upper surface of the p-type semiconductor layer toward the bottom surface of the n-type semiconductor layer.

6 Claims, 11 Drawing Sheets

(56) References Cited

U.S. PATENT DOCUMENTS

| | | | |
|---|---|---|---|
| 2010/0187598 A1* | 7/2010 | Endo | H01L 29/66325 257/329 |
| 2012/0032305 A1* | 2/2012 | Kitamura | H01L 29/167 257/607 |
| 2013/0075783 A1* | 3/2013 | Yamazaki | H01L 21/263 257/139 |
| 2014/0070369 A1* | 3/2014 | Kitamura | H01L 21/22 257/607 |
| 2014/0077253 A1* | 3/2014 | Soeno | H01L 29/32 257/139 |
| 2014/0226376 A1 | 8/2014 | Hayashiguchi | |
| 2015/0206758 A1* | 7/2015 | Kato | H01L 21/265 438/459 |
| 2015/0228717 A1* | 8/2015 | Hara | H01L 29/0626 257/140 |
| 2017/0263603 A1* | 9/2017 | Hata | H01L 29/7397 |

FOREIGN PATENT DOCUMENTS

| | | |
|---|---|---|
| JP | H10321876 A | 12/1998 |
| JP | 2002185017 A | 6/2002 |
| JP | 2005183605 A | 7/2005 |
| JP | 2008004704 A | 1/2008 |
| JP | 2008236932 A | 10/2008 |
| JP | 4354213 B2 | 10/2009 |
| JP | 2016001671 A | 1/2016 |

* cited by examiner

HIGH-SPEED DIODE WITH CRYSTAL DEFECTS AND METHOD OF MANUFACTURING

CROSS-REFERENCE TO RELATED APPLICATIONS

The present application corresponds to Japanese Patent Application No. 2016-100861 filed at the Japan Patent Office on May 19, 2016, and the entire disclosure of the application is incorporated herein by reference.

Technical Field

The present invention relates to a semiconductor device and a method of manufacturing the same, and more particularly relates to a diode which is referred to as a high-speed diode (fast recovery diode (FRD)) and which has a short reverse recovery time and a method of manufacturing such a diode.

Background Art

A fast recovery diode is publicly known, and is utilized for the rectification of a high-frequency power supply or the like. Among conventional fast recovery diodes, there are diodes which realize excellent on-off characteristics by introducing a lifetime killer by means of electron beam irradiation in order to shorten a reverse recovery time trr at the time of switching (for example, Patent literature 1: Japanese Patent Application Publication No. 2005-183605).

SUMMARY OF INVENTION

FIG. 15 is a block diagram (partially including a circuit diagram) of a motor drive device.

The motor drive device 500 is a semiconductor device which is formed by integrating a hall comparator 511, a logic portion 512, a driver portion 513, a triangular wave oscillator 514, a PWM comparator 515 and a rotation speed detection portion 516. A motor 502 (for example, a three-phase full wave motor) which is a target to be driven and hall sensors 503U, 503V and 503W which are respectively added to the coils of the individual phases (U phase, V phase and W phase) in the motor 502 are externally connected to the motor drive device 500.

The hall comparator 511 is a means which compares sinusoidal hall signals (+/−) of the individual phases input from the hall sensors 503U, 503V and 503W with each other so as to generate rectangular output signals of the individual phases and which feeds them out to the logic portion 512.

The logic portion 512 is a means which generates drive signals UH, UL, VH, VL, WH and WL of the individual phases in the motor 502 and feeds them out to the driver portion 513. The logic portion 512 has the function of generating a rotation speed signal RV (signal indicating the rotation speed of the motor 502) based on the output signals of the individual phases in the hall comparator 511 and has the function of controlling the rotation speed of the motor 502 based on a PWM signal generated in the PWM comparator 515.

The driver portion 513 is a means which supplies desired drive currents IU, IV and IW to the coils of the individual phases in the motor 502, and is formed to include, as switching elements, p-channel IGBTs P1 to P3 and n-channel IGBTs N1 to N3. The emitters of the IGBTs P1 to P3 are connected to a power supply line, and the emitters of the IGBTs N1 to N3 are connected to a ground line. The collectors of the IGBTs P1 to P3 and the collectors of the IGBTs N1 to N3 are commonly connected for each of the phases, and the connection nodes thereof are connected to one ends of the individual coils in the motor 502. FRDs (fast recovery diodes) Di1 to Di6 are respectively connected in an opposite direction to the IGBTs P1 to P3 and N1 to N3. The other ends of the coils of the individual phases in the motor 502 are commonly connected to each other. The drive signals (UH, UL, VH, VL, WH and WL) of the individual phases are applied from the logic portion 512 to the gates of the IGBTs P1, N1, P2, N2, P3 and N3.

The triangular wave oscillator 514 is, for example, a means which charges and discharges a capacitor to generate a desired triangular wave voltage V2 and which applies it to the inverting input terminal (−) of the PWM comparator 515. The triangular wave oscillator 514 has the function of changing, based on a control signal CTRL from the rotation speed detection portion 516, for example, the capacity of the capacitor or the amount of current at the time of charging and discharging so as to vary and control the oscillation frequency of the triangular wave voltage V2.

The PWM comparator 515 is a means which generates a PWM signal for comparing a speed instruction voltage V1 applied to the non-inverting input terminal (+) with the triangular wave voltage V2 applied to the inverting input terminal (−) so as to chop the on-period of the switching elements in the driver portion 513. When the speed instruction voltage V1 is higher than the triangular wave voltage V2, the PWM signal becomes high-level whereas when the speed instruction voltage V1 is lower than the triangular wave voltage V2, the PWM signal becomes low-level. The speed instruction voltage V1 is a voltage signal whose voltage value is varied and controlled according to a desired rotation speed, and when the rotation speed of the motor 502 is increased, the speed instruction voltage V1 is set high whereas when the rotation speed of the motor 502 is lowered, the speed instruction voltage V1 is set low.

The rotation speed detection portion 516 is a means which detects the rotation speed of the motor 502 based on the rotation speed signal RV input from the logic portion 512, and which feeds out a control signal CTRL corresponding to the results of the detection to the triangular wave oscillator 514.

In recent years, as higher outputs have been produced by electric vehicles (EVs) and hybrid electric vehicles (HEVs), switching elements are often used with high power, and the current capability of, for example, several tens of amperes to several hundreds of amperes is required.

Conventionally, the semiconductor elements for high output applications described above generally cope with the high output applications by increasing chip areas.

On the other hand, in particular, in inverter circuits for driving motors used for EVs and HEVs, not only high environmental resistance and high vibration resistance but also a significant reduction in size is required, and hence, unlike the conventional method, it is impossible to simply increase chip areas.

In the applications described above, for example, thin and high-efficient IGBTs and FRDs which are produced by a wafer thinning technology using an FZ wafer are used. In the IGBTs and FRDs which use the thin wafers described above, satisfactory Vf characteristics are obtained, and thus it is possible to efficiently pass a large current even with a small chip area.

Furthermore, the fast recovery diode using such a thin wafer is highly demanded by the market to shorten a reverse recovery time trr caused at the time of switching (that is, to speed up the trr) and to reduce switching noise caused by a surge voltage (switching reverse voltage Vr), and it is desired to provide a diode which satisfies these requirements.

For the former requirement to shorten the reverse recovery time trr, for example, as disclosed in patent literature 1 described above, it is confirmed that it is possible to make improvements by speeding up the recombination time of carriers in the entire surface of the device by means of electron beam irradiation.

However, for the latter requirement to reduce the surge voltage Vr, no sufficiently effective configuration has so far been realized.

Although the occurrence of noise is mainly dominated by the distribution of a small number of carriers, it is also affected by the state of a depletion layer at the time of operation. Although it is necessary to thin a wafer in order to improve characteristics with a small chip, in a state where the thickness is thin, when a withstand voltage is provided in a reverse recovery operation, the depletion layer inevitably hits the back surface earlier (the depletion layer spreads from the front surface).

When the depletion layer hits the back surface earlier, this contributes to the occurrence of a surge, and thus a surge easily occurs in a thin chip (the depletion layer hits the back surface, and thus carriers are swept earlier).

Hence, when diodes are applied to the inverter circuits of EVs and HEVs as described above, withstand voltage elements of 600 to 1200 V are required. In this case, when the thickness of a wafer is equal to or less than 150 μm, a surge voltage caused by a depletion layer becomes problematic. In order for a withstand voltage of 600 V to be obtained, the thickness of the wafer is preferably equal to or more than 50 μm.

The present invention is made in view of the foregoing background, and has an object to reduce voltage noise at the time of a low current in a high-speed diode (fast recovery diode).

The present invention also has an object to provide a method of manufacturing a high-speed diode (fast recovery diode) in which voltage noise at the time of a low current is reduced.

A high-speed diode according to a preferred embodiment of the present invention includes an n-type semiconductor layer and a p-type semiconductor layer which is laminated on the n-type semiconductor layer, where a pn junction is formed in a boundary portion between the n-type semiconductor layer and the p-type semiconductor layer, and crystal defects are formed such that the frequency of appearance is gradually decreased from an upper surface of the p-type semiconductor layer toward a bottom surface of the n-type semiconductor layer.

In the high-speed diode according to the preferred embodiment of the present invention, the n-type semiconductor layer may include a high concentration n-type semiconductor substrate and a low concentration n-type semiconductor layer which is laminated on the upper surface of the high concentration n-type semiconductor substrate by epitaxial growth, and the pn junction may be formed in a boundary portion between the low concentration n-type semiconductor layer and the p-type semiconductor layer.

In the high-speed diode according to the preferred embodiment of the present invention, a cathode electrode may be connected to the lower surface of the high concentration n-type semiconductor substrate, and an anode electrode may be connected to the upper surface of the p-type semiconductor layer.

A method of manufacturing the high-speed diode according to the preferred embodiment of the present invention includes a step of preparing a semiconductor wafer in which a pn junction is formed, and a step of irradiating an electron beam by a predetermined acceleration voltage from the front surface of the semiconductor wafer on a position in which the pn junction is formed toward the pn junction portion, where the electron beam is irradiated to the semiconductor wafer such that a relative dose is decreased with increasing a distance in a depth direction from an upper surface of the wafer by interposing a predetermined absorber between an output portion for the electron beam and the front surface of the semiconductor wafer receiving the irradiation of the electron beam in the step of irradiating an electron beam.

In the method of manufacturing the high-speed diode according to the preferred embodiment of the present invention, the predetermined absorber may be a semiconductor wafer which is separate from a target to be processed.

Advantageous Effects of Invention

According to the present invention, it is possible to provide a high-performance high-speed diode in which a reverse recovery time trr caused at the time of switching is shortened, in which a surge voltage is reduced such that voltage noise at the time of a low current is reduced and which copes with market demands.

According to the present invention, it is also possible to provide a simple method for manufacturing the high-speed diode described above, and consequently, it is possible to contribute to the development of the industry.

DESCRIPTION OF EMBODIMENTS

A preferred embodiment of the present invention will be specifically described below with reference to the drawings.

Figure 1:
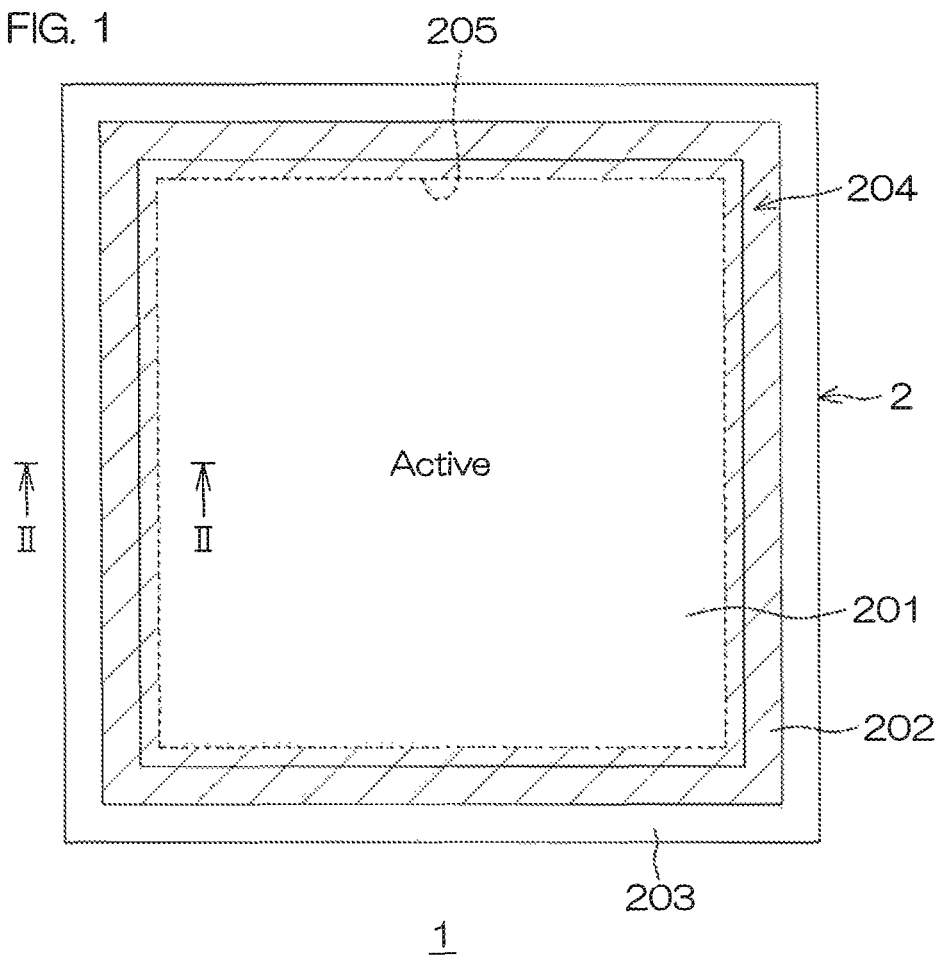
FIG. 1 is a schematic plan view of a pn diode according to a preferred embodiment of the present invention.
Figure 2:
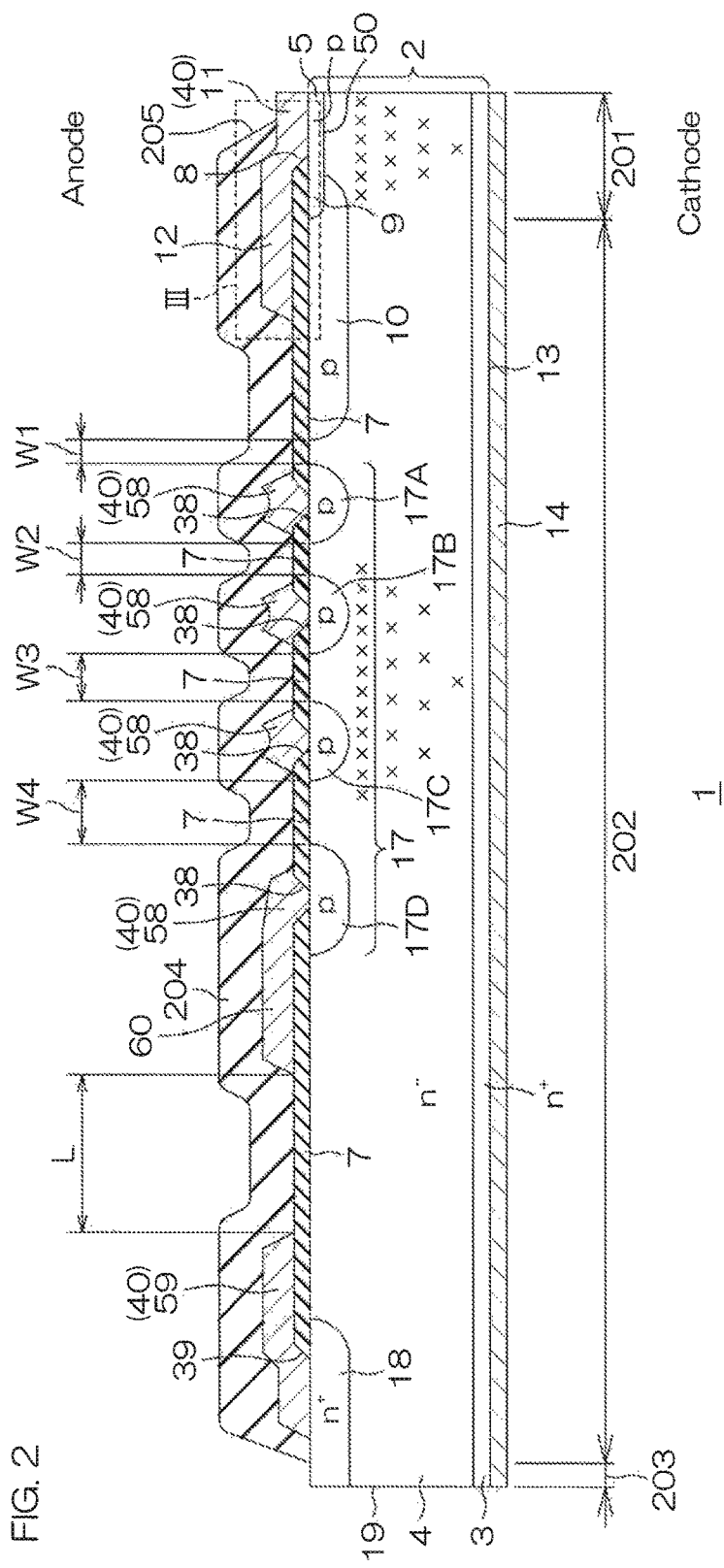
FIG. 2 is a cross-sectional view taken along section line II-II in FIG. 1.

FIG. 1 is a schematic plan view of a pn diode 1 according to the preferred embodiment of the present invention. FIG. 2 is a cross-sectional view taken along section line II-II in FIG. 1.

The pn diode 1 is formed in the shape of, for example, a square chip in plan view or a rectangular chip in plan view. The chip size thereof may be 1.0 mm×1.0 mm to 20 mm×20 mm. The pn diode 1 includes an active region 201, an outer peripheral region 202 which surrounds the active region 201 and a scribe region 203 which surrounds the outer peripheral region 202. A surface protection film 204 (hatched portion of FIG. 1) is formed so as to cover the active region 201 and the outer peripheral region 202 and to expose the scribe region 203. In the surface protection film 204, an opening 205 is formed so as to expose, as a pad, part of an anode electrode 11 which will be described later.

The pn diode 1 includes a semiconductor layer 2. The semiconductor layer 2 includes an $n^+$ type region 3 and an $n^-$ type region 4. The semiconductor layer 2 may be formed by epitaxially growing the $n^-$ type region 4 on the $n^+$ type region 3 serving as a base substrate or may be formed with an FZ wafer.

In the active region 201 of the semiconductor layer 2, a p-type region 5 is formed. The p-type region 5 may be an impurity diffusion layer which is selectively formed in the front surface portion of the n type region 4. In this way, in the semiconductor layer 2, a pn junction is formed between the p-type region 5 and the $n^-$ type region 4.

In the outer peripheral region 202 of the front surface portion of the $n^-$ type region 4, a p-type well 10 and p-type FLRs (Field Limiting Ring) 17 are formed. The p-type well 10 is formed in the shape of a ring whose outside diameter is larger than the diameter of the p-type region 5, and is arranged so as to cover, from below, the entire peripheral edge portion 9 of the p-type region 5. The outer peripheral edge of the p-type well 10 is arranged outside the outer peripheral edge of the p-type region 5.

A plurality of p-type FLRs 17 are formed so as to surround the p-type well 10. In the preferred embodiment, the p-type FLRs 17 include four p-type FLRs 17A to 17D which are sequentially arranged from a side close to the p-type well 10 to a side away from the p-type well 10. The intervals W1 to W4 between the p-type FLRs 17 adjacent to each other (for the innermost p-type FLR 17, the interval between the p-type FLR 17 and the p-type well 10) are sequentially increased as the p-type FLRs 17 are located from the side close to the p-type well 10 to the side away from the p-type well 10. For example, the approximate intervals may be such that the interval W1=15 μm, the interval W2=17 μm, the interval W3=19 μm and the interval W4=23 μm.

In the outer peripheral region 202 of the front surface portion of the $n^-$ type region 4, an $n^+$ type channel stop region 18 is further formed. The $n^+$ type channel stop region 18 may be formed so as to extend from the outer peripheral region 202 to an end surface 19 of the semiconductor layer 2.

On the front surface 6 of the semiconductor layer 2, a field insulating film 7 is formed. The field insulating film 7 includes a contact hole 8 through which the p-type region 5 is selectively exposed. The p-type region 5 is formed over the inward region of the contact hole 8 and is further extended to the outside of the contact hole 8 so as to straddle the contact hole 8. In this way, the peripheral edge portion 9 of the p-type region 5 is covered with the field insulating film 7. The contact hole 8 may have, for example, a tapered side surface such that its diameter is narrowed from the opening end toward the front surface 6 of the semiconductor layer 2.

The field insulating film 7 also includes contact holes 38 through which the p-type FLRs 17 are selectively exposed and an outer peripheral removal region 39 through which the $n^+$ type channel stop region 18 is selectively exposed.

On the front surface 6 of the semiconductor layer 2, an electrode film 40 is selectively formed. The electrode film 40 includes the anode electrode 11, field plates 58 and an EQR (EQui-potential Ring) 59.

The anode electrode 11 is connected to the p-type region 5 within the contact hole 8 of the field insulating film 7. The anode electrode 11 also includes an overlap portion 12 which is passed from the contact hole 8 over the field insulating film 7 so as to be opposite the peripheral edge portion 9 of the p-type region 5 and the p-type well 10 through the field insulating film 7. The position of the outer peripheral edge of the overlap portion 12 may be between the outer peripheral edge of the p-type region 5 and the outer peripheral edge of the p-type well 10.

The field plates 58 are respectively formed in the p-type FLRs 17A to 17D. The field plates 58 are connected to the p-type FLRs 17A to 17D within the contact holes 38 of the field insulating film 7. The outermost field plate 58 which is connected to the p-type FLR 17D includes a drawing portion 60 which is drawn to the end surface side 19 on the field insulating film 7. The length of the drawing portion 60 may be, for example, about 50 μm.

The EQR 59 is connected to the $n^+$ type channel stop region 18 within the outer peripheral removal region 39 of the field insulating film 7. A distance L (insulating distance) between the inner peripheral edge of the EQR 59 and the outmost field plate 58 may be, for example, 30 μm to 60 μm.

The surface protection film 204 is formed so as to cover the electrode film 40.

On the back surface 13 of the semiconductor layer 2, a cathode electrode 14 is formed. The cathode electrode 14 is connected to the $n^+$ type region 3 on the back surface 13 of the semiconductor layer 2.

A description will be given below of the details of the individual portions of the pn diode 1.

The semiconductor layer 2 is formed of, for example, a semiconductor material containing Si, and specifically, the semiconductor layer 2 may be formed of Si or SiC.

The $n^+$ type region 3, the $n^-$ type region 4 and the $n^+$ type channel stop region 18 are semiconductor regions which contain an n-type impurity. As the contained n-type impurity, for example, N (nitrogen), P (phosphorus), As (arsenic) and the like can be used (hereinafter, the same is applied when the n-type impurity is mentioned). The impurity concentration of the $n^+$ type region 3 may be, for example, $1 \times 10^{17}$ cm$^{-3}$ to $1 \times 10^{22}$ cm$^{-3}$, the impurity concentration of the $n^-$ type region 4 may be, for example, $1 \times 10^{13}$ cm$^{-3}$ to $1 \times 10^{15}$ cm$^{-3}$ and the impurity concentration of the $n^+$ type channel stop region 18 may be, for example, $1 \times 10^{17}$ cm$^{-3}$ to $1 \times 10^{22}$ cm$^{-3}$. The thickness of the $n^+$ type region 3 may be, for example, 0.3 μm to 600 μm, and the thickness of the $n^-$ type region 4 may be, for example, 30 μm to 300 μm. The depth of the $n^+$ type channel stop region 18 from the front surface 6 may be, for example, 2 μm to 3 μm.

The p-type region 5, the p-type well 10 and the p-type FLRs 17 are semiconductor regions which contain a p-type impurity. As the contained p-type impurity, for example, B (boron), Al (aluminum), Ar (argon) and the like can be used (hereinafter, the same is applied when the p-type impurity is mentioned). Although the impurity concentrations of the p-type region 5, the p-type well 10 and the p-type FLRs 17 are, for example, $1\times10^{15}$ $cm^{-3}$ to $1\times10^{20}$ $cm^{-3}$, in the preferred embodiment, within this range, the impurity concentration of the p-type region 5 is lower than the impurity concentrations of the p-type well 10 and the p-type FLRs 17. The depth of the p-type region 5 from the front surface 6 is shallower than the depths of the p-type well 10 and the p-type FLRs 17, and is, for example, 1 μm to 3 μm. On the other hand, the depths of the p-type well 10 and the p-type FLRs 17 from the front surface 6 are the same as each other, and may be, for example, 6 μm to 10 μm.

The field insulating film 7 can be formed of, for example, $SiO_2$ (silicon oxide), and can be formed by, for example, thermal oxidation or CVD (Chemical Vapor Deposition). The thickness of the field insulating film 7 may be, for example, 0.5 μm to 5.0 μm.

The surface protection film 204 can be formed of, for example, polyimide, and can be formed by, for example, a spin coat method.

The feature of the pn diode 1 according to the preferred embodiment is that crystal defects are formed such that the frequency of appearance is gradually decreased from the upper surface of the $p^+$ type region 5 toward the bottom surface of the $n^-$ type region 4. Although the crystal defects are structural defects on the atomic and molecular level, and it is difficult to illustrate them in FIG. 2, FIG. 2 schematically shows that "x"s are added to the $n^-$ type region 4 such that the number of "x"s is sequentially changed from the upper side where a large number of crystal defects are present to the lower side where a small number of crystal defects are present, that a large number of crystal defects are formed on the side of a pn junction portion 50 of the $p^+$ type region 5 and the $n^-$ type region 4 and that the proportion of formed crystal defects is decreased toward the bottom surface of the $n^-$ type region 4. The crystal defects are formed not only in the active region 201 but also in the outer peripheral region 202. Although in FIG. 2, for clarification, only crystal defects immediately below the p-type FLRs 17 are shown, crystal defects may be formed in the portions other than the outer peripheral region 202.

As described above, the feature of the pn diode 1 according to the preferred embodiment is that, within the $n^-$ type region 4, the gradient distribution of crystal defects from large to small is provided from the pn junction portion 50 to the bottom surface of the $n^-$ type region 4. Then, the distribution of the recombination time of carriers within the $n^-$ type region 4 is adjusted such that the time is shortened on the side of the front surface (the side of the pn junction portion 50) and that the time is prolonged on the side of the back surface (the side of the bottom portion of the $n^-$ type region 4) (see FIG. 6 which will be described later).

The main parts of a production method in a method of manufacturing the pn diode 1 according to the preferred embodiment will next be described.

(1) Preparation of a Semiconductor Wafer

Figure 3A:
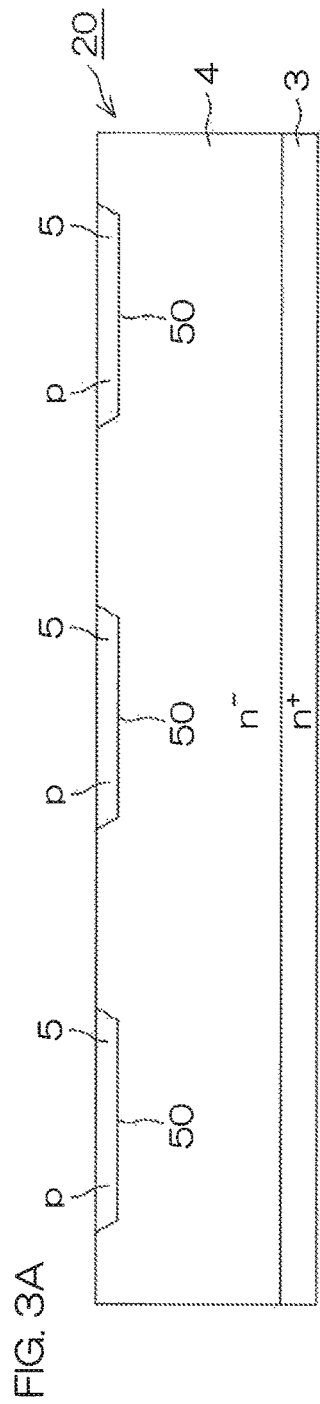
FIG. 3A and FIG. 3B are diagrams showing a method of manufacturing the pn diode.

As shown in FIG. 3A, a semiconductor wafer 20 for producing the pn diode 1 is first prepared. As the semiconductor wafer 20, for example, a semiconductor wafer of an $n^-$ type silicon single crystal manufactured by an FZ method is prepared. In other words, in the stage in which the semiconductor wafer 20 is prepared, the entire semiconductor wafer 20 is the $n^-$ type region 4.

Then, in the front surface side of the semiconductor wafer 20, a front surface side element structure portion such as the $p^+$ type region 5 is formed. Although in FIG. 3A, for clarification, only the $p^+$ type region 5 in the active region 201 are shown, a step of forming the front surface side element structure portion may include a step of forming, for example, impurity regions such as the p-type FLRs 17 in the outer peripheral region 202.

Then, a support substrate (not shown) is joined to the front surface side of the semiconductor wafer 20 via an adhesive tape or the like. The adhesive tape may have a configuration in which on both sides of a tape base member made of PET, a foaming agent portion formed with a foaming tape-type sheet that can be separated by being foamed with heating and a UV tape layer formed with a heat resistant UV tape-type sheet that can be separated by the curing of an adhesive with the application of UV light are individually provided. The UV tape layer of the adhesive tape is adhered to the support substrate.

Then, in a state where the support substrate is joined, the back surface of the semiconductor wafer 20 is ground by back grinding, wet etching or the like, and thus the thickness of the entire semiconductor wafer 20 including the front surface side element structure portion is reduced to a desired thickness.

Then, for example, phosphorus or the like which is an n-type impurity is injected into the back surface of the semiconductor wafer 20. Thereafter, for example, laser is applied to the back surface of the semiconductor wafer 20, and annealing is performed. In this way, the $n^+$ type region 3 which serves as a cathode layer is formed.

Then, on the entire back surface of the semiconductor wafer 20, for example, a plurality of metal films such as aluminum, titanium, nickel and gold are formed, and thus a back surface electrode which serves as the cathode electrode 14 is formed.

(2) Electron Beam Irradiation Process

Figure 3B:
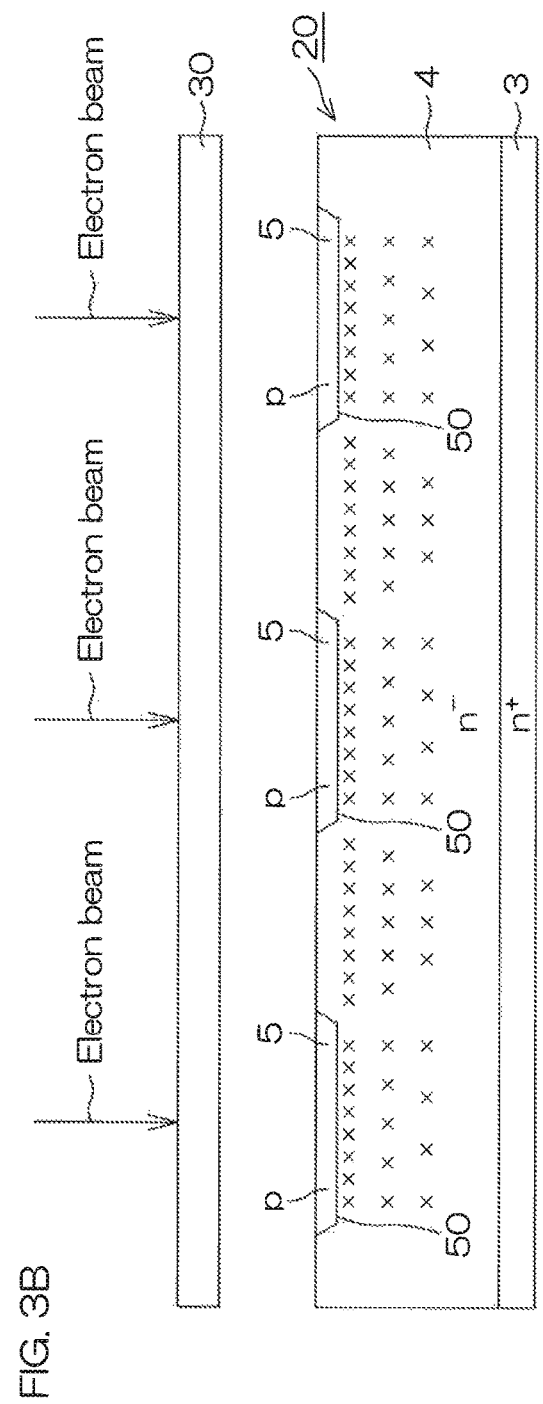

FIG. 3B is a diagram schematically showing a process for irradiating an electron beam to the semiconductor wafer 20 (see FIG. 3A) which is prepared as described above.

The electron beam is irradiated to the semiconductor wafer 20 from the front surface side (the side where the $p^+$ type regions 5 are formed).

When the electron beam is irradiated, an acceleration voltage for the electron beam is set low, and an absorber 30 formed with, for example, a silicon wafer is inserted between an output portion for the electron beam and the semiconductor wafer 20, and the electron beam is irradiated.

Figure 4:
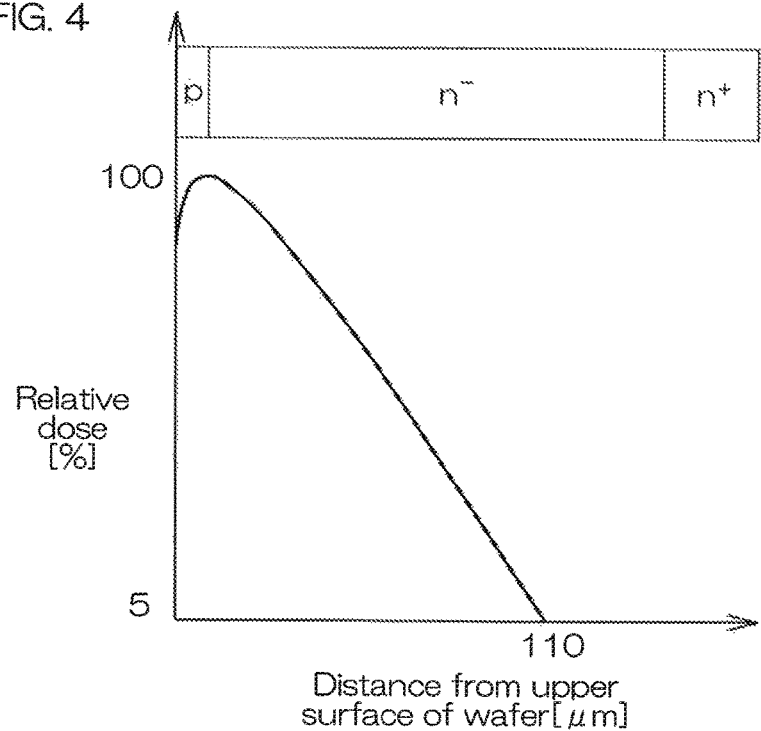
FIG. 4 is a graph showing variations in the relative dose of an electron beam irradiated to a semiconductor wafer.

Here, the acceleration voltage when the electron beam is irradiated, the thickness of the absorber 30 and the like are adjusted such that the relative dose of the electron beam which reaches the semiconductor wafer 20 by the irradiation of the electron beam is a relative dose shown in FIG. 4.

Although electrons entering the semiconductor wafer 20 by the irradiation of the election beam are passed through the interior of the semiconductor wafer 20 for a given distance, and thus the electrons lose their energy, they form defects in the crystal of the semiconductor wafer 20 when they are passed therethrough. As shown in FIG. 4, the relative dose of the electron beam irradiated to the semiconductor wafer 20 is decreased as the distance from the upper surface of the semiconductor wafer 20 in a depth direction is increased, and thus a larger number of electrons enter the upper surface of the semiconductor wafer 20 and as the distance from the upper surface of the semiconductor wafer 20 in the depth direction is increased, the number of entering electrons is decreased. Since the entering electrons destroy the crystal structure to cause crystal defects, a structure is formed in which the frequency of appearance of crystal defects in the semiconductor wafer 20 is high in the upper surface of the semiconductor wafer 20 and in which as the frequency of appearance is gradually decreased as the semiconductor wafer 20 extends from the upper surface toward the bottom surface.

Figure 5:
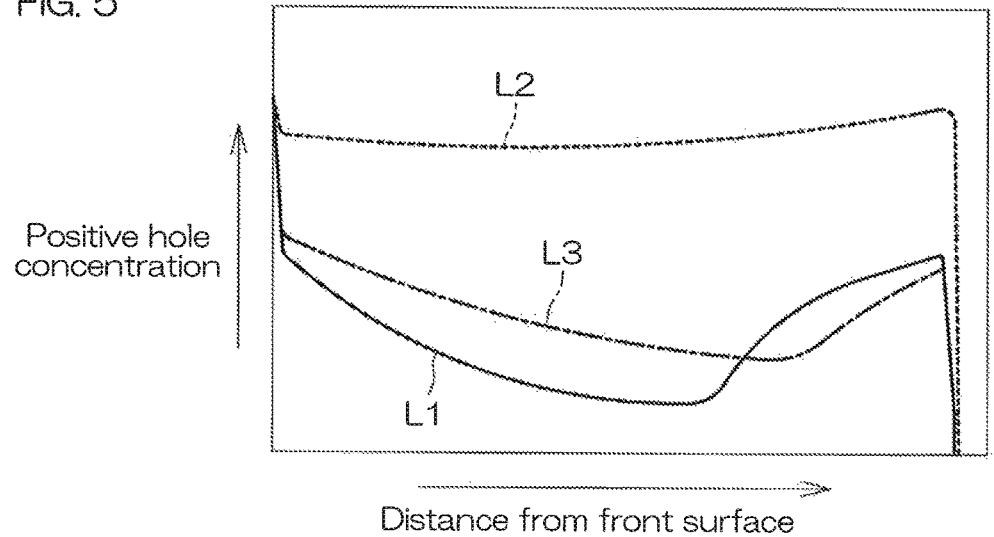
FIG. 5 is a graph showing a positive hole concentration distribution at the time of a low current in a semiconductor in which a pn junction is formed.

When as described above, in the semiconductor wafer 20, crystal defects are formed such that the frequency of appearance is gradually decreased as the semiconductor wafer 20 extends from the upper surface of the $p^+$ type region 5 toward the bottom surface of the $n^-$ type region 4, a positive hole concentration distribution at the time of a low current is a distribution shown in FIG. 5. The low current indicates that for example, a forward current density at the time of operation is equal to or less than 1 A/mm².

FIG. 5 is a graph showing a positive hole concentration distribution at the time of the low current in a semiconductor in which a pn junction is formed, and the vertical axis represents a positive hole concentration and the horizontal axis represents a distance from the front surface of the semiconductor.

In FIG. 5, a solid line L1 represents the positive hole concentration distribution at the time of the low current in the semiconductor to which the electron beam is irradiated with the relative dose of the electron beam shown in FIG. 4. As reference, a broken line L2 represents a positive hole concentration distribution at the time of the low current in the semiconductor which is not subjected to the electron beam irradiation process, and an alternate long and short dashed line L3 represents a positive hole concentration distribution at the time of the low current in the semiconductor to which the electron beam is irradiated without use of the absorber 30. The electron beam is irradiated to the semiconductor represented by the alternate long and short dashed line L3 under the same electron beam irradiation conditions as the semiconductor represented by the solid line L1, and the semiconductor represented by the alternate long and short dashed line L3 differs from the semiconductor represented by the solid line L1 only in whether or not the absorber 30 is present when the electron beam is irradiated.

As described above, the semiconductor to which the electron beam is irradiated with the relative dose of the electron beam shown in FIG. 4 has the positive hole concentration distribution in which, as represented by the solid line of FIG. 5, as compared with the semiconductor (the broken line L2) which is not subjected to the electron beam irradiation process and the semiconductor (the alternate long and short dashed line L3) to which the electron beam is irradiated without use of the absorber 30, a small number of positive holes are present in the front surface side of the semiconductor, and in which the number of positive holes is increased as the distance from the front surface is increased.

Since the semiconductor wafer 20 according to the preferred embodiment receives the electron beam irradiation with the relative dose shown in FIG. 4, the positive hole concentration distribution at the time of the low current is the positive hole concentration distribution represented by the solid line L1 of FIG. 4.

Then, in the positive hole concentration distribution described above, as shown in FIG. 6, the recombination time of carriers in the longitudinal direction within the semiconductor is changed with the distance from the front surface, and thus it is possible to shorten the recombination time of carriers in the front surface side and to prolong the recombination time of carriers in the back surface side.

Figure 6:
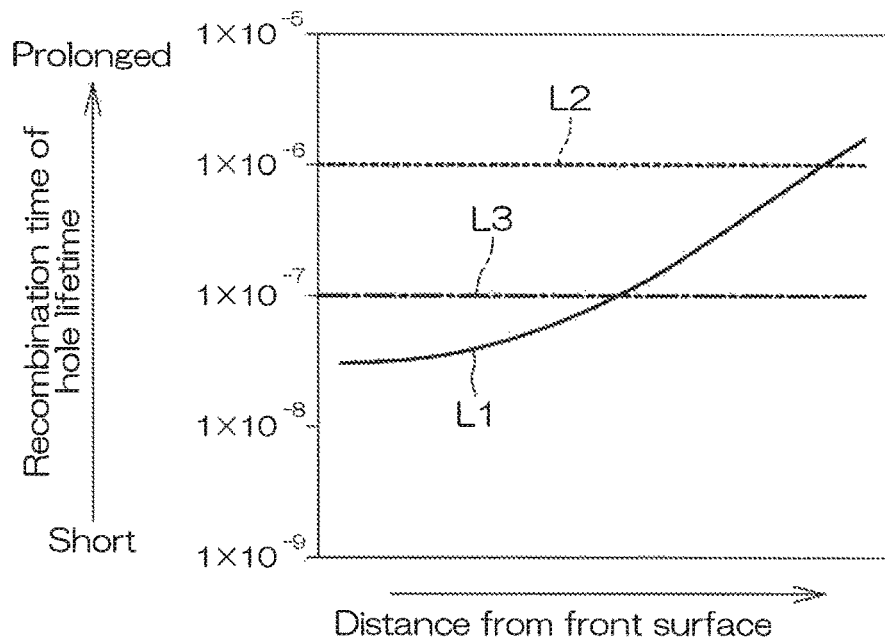
FIG. 6 is a graph showing the recombination time of carriers in a longitudinal direction within a semiconductor layer (within a device).

FIG. 6 is a graph showing the distribution of the recombination time of carriers in the longitudinal direction within the semiconductor layer (within the device). The vertical axis represents the lifetime recombination time of positive holes, and the recombination time is shortened from below to above the vertical axis. The horizontal axis represents a distance from the front surface (the depth within the semiconductor layer). A solid line L1 represents the characteristics of the semiconductor element according to the preferred embodiment, a broken line L2 represents the characteristics when the electron beam is not irradiated and an alternate long and short dashed line L3 represents the characteristics when the electron beam is uniformly irradiated.

When the electron beam is irradiated such that, as shown in FIG. 4, the relative dose is reduced according to the distance from the upper surface of the semiconductor, as represented by the solid line L1 of FIG. 6, the lifetime recombination time of positive holes is shortened in the front surface side, and the lifetime recombination time of holes is prolonged as the semiconductor extends away from the front surface.

Figure 7:
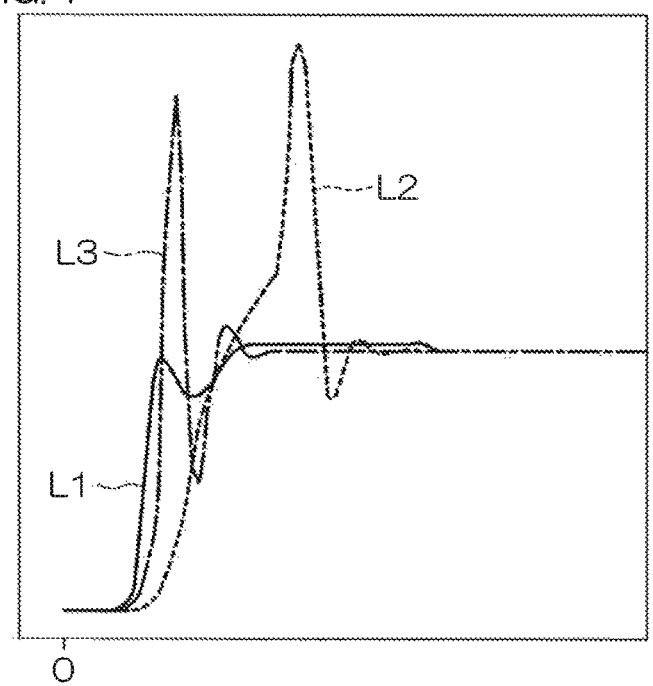
FIG. 7 is a graph showing the waveform of a reverse voltage Vr at the time of switching.

Consequently, as shown in FIG. 7, voltage noise which is caused by a reverse voltage Vr at the time of switching can be reduced.

FIG. 7 shows the reverse voltage Vr at the time of switching, a solid line L1 represents the characteristics of the pn diode 1 according to the preferred embodiment, a broken line L2 represents the waveform of the reverse voltage Vr in a conventional high-speed diode which is not subjected to the electron beam irradiation process and an alternate long and short dashed line L3 represents the waveform of the reverse voltage Vr in a high-speed diode to which the electron beam is uniformly irradiated. As is clear from the waveform diagram, in the pn diode 1 according to the preferred embodiment, significant surge voltage reduction is realized.

Figure 8:
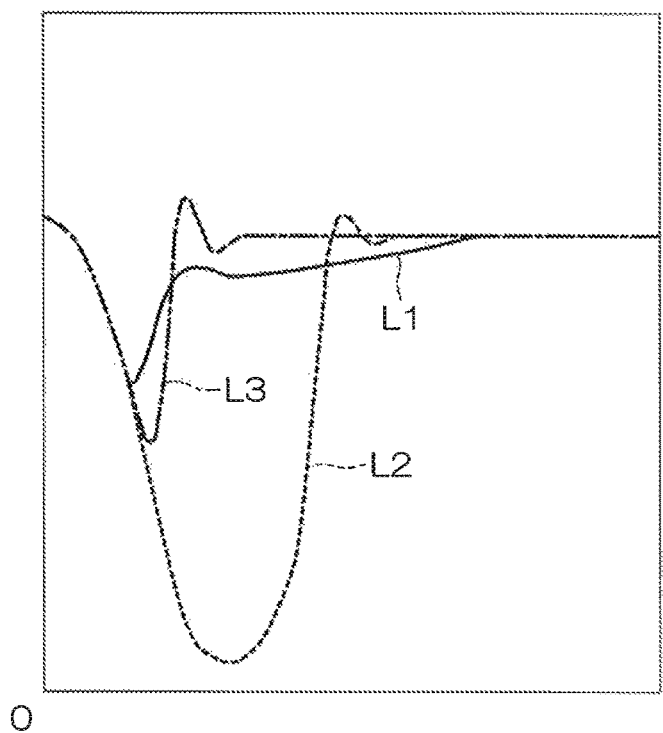
FIG. 8 is a graph showing the waveform of a reverse recovery time trr at the time of switching.

FIG. 8 is a graph showing that, in the pn diode 1 according to the preferred embodiment, the reduction of a reverse recovery time trr is realized.

In FIG. 8, the vertical axis represents a voltage change, and the horizontal axis represents time. A solid line L1 represents the waveform of a switching reverse recovery time trr in the pn diode 1 according to the preferred embodiment, a broken line L2 represents the waveform of a trr in the conventional high-speed diode and an alternate long and short dashed line L3 represents the waveform of a trr in the high-speed diode to which the electron beam is uniformly irradiated.

Figure 9:
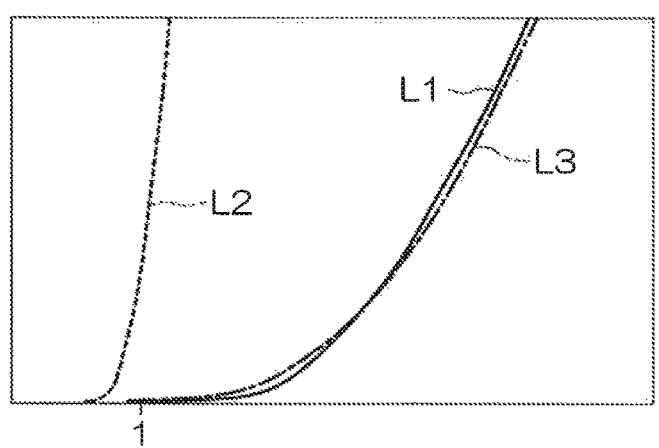
FIG. 9 a graph showing the forward voltage Vf characteristics of a high-speed diode.

FIG. 9 is a diagram further showing the forward voltage Vf characteristics of the high-speed diode, a solid line L1 represents the forward voltage Vf characteristics of the pn diode 1 according to the preferred embodiment, a broken line L2 represents the forward voltage Vf characteristics of the conventional high-speed diode and an alternate long and short dashed line L3 represents the forward voltage Vf characteristics of the high-speed diode to which the electron beam is uniformly irradiated.

As shown in FIG. 9, it is demonstrated that even when crystal defects where the frequency of appearance is changed are formed in the semiconductor layer, the forward voltage Vf characteristics of the high-speed diode are not affected.

<Description of Package>

Figure 10:
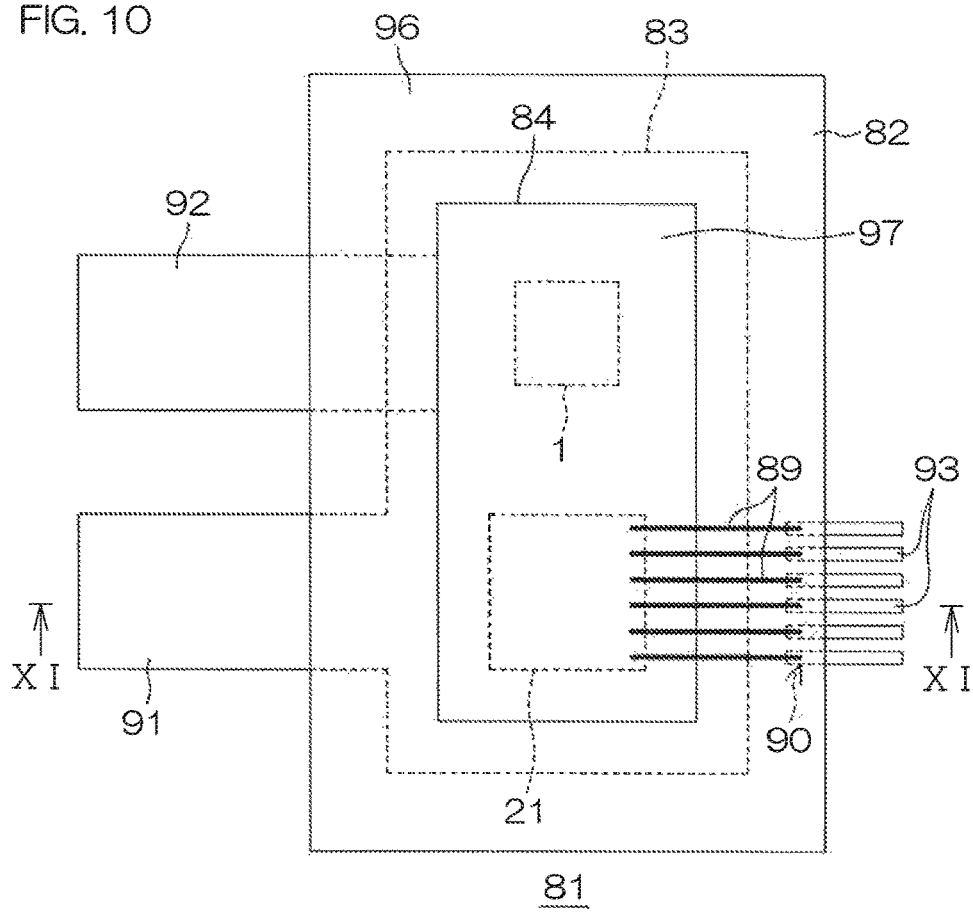
FIG. 10 is a schematic plan view of a semiconductor package which includes an IGBT and the pn diode described above.
Figure 11:
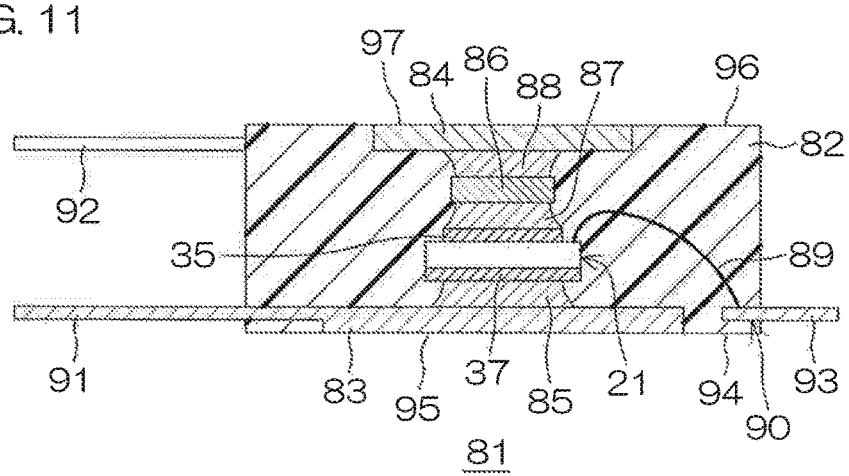
FIG. 11 is a cross-sectional view taken along section line XI-XI in FIG. 10.

FIG. 10 is a schematic plan view of a semiconductor package which includes an IGBT and the pn diode described previously. FIG. 11 is a cross-sectional view taken along section line XI-XI in FIG. 10.

The configuration of the package which includes the pn diode 1 and the IGBT 21 will next be described with reference to FIGS. 10 and 11.

The semiconductor package 81 is a double-sided heat dissipation type package, and can dissipate heat from both the upper and lower surfaces of a resin package 82.

The semiconductor package 81 includes a lower heat spreader 83, an upper heat spreader 84 and the IGBT 21 and the pn diode 1 which are sandwiched between the lower heat spreader 83 and the upper heat spreader 84. As the IGBT 21, a general IGBT can be used.

The IGBT 21 and the pn diode 1 are provided on the lower heat spreader 83 by respectively joining the cathode electrode 14 (not shown) and a collector electrode 37 to the lower heat spreader 83 with a solder 85. Between the emitter electrode 35 of the IGBT 21 and the anode electrode 11 (not shown) of the pn diode 1 and the upper heat spreader 84, a conductive spacer 86 formed of, for example, Cu is provided. The emitter electrode 35 and the anode electrode 11 are joined to the conductive spacer 86 with a solder 87, and the conductive spacer 86 is joined to the upper heat spreader 84 with a solder 88. The IGBT 21 is connected to a plurality of leads 90 with bonding wires 89.

The resin package 82 covers the lower heat spreader 83, the upper heat spreader 84 and part of the leads 90 such that they are exposed as terminals 91, 92 and 93. One surface of the lower heat spreader 83 is exposed as a heat dissipation surface 95 from the lower surface 94 of the resin package 82. On the other hand, one surface of the upper heat spreader 84 is exposed as a heat dissipation surface 97 from the upper surface 96 of the resin package 82.

<Description of Module>

An example of the configuration of a module which uses the pn diode 1 will next be shown.

Figure 12:
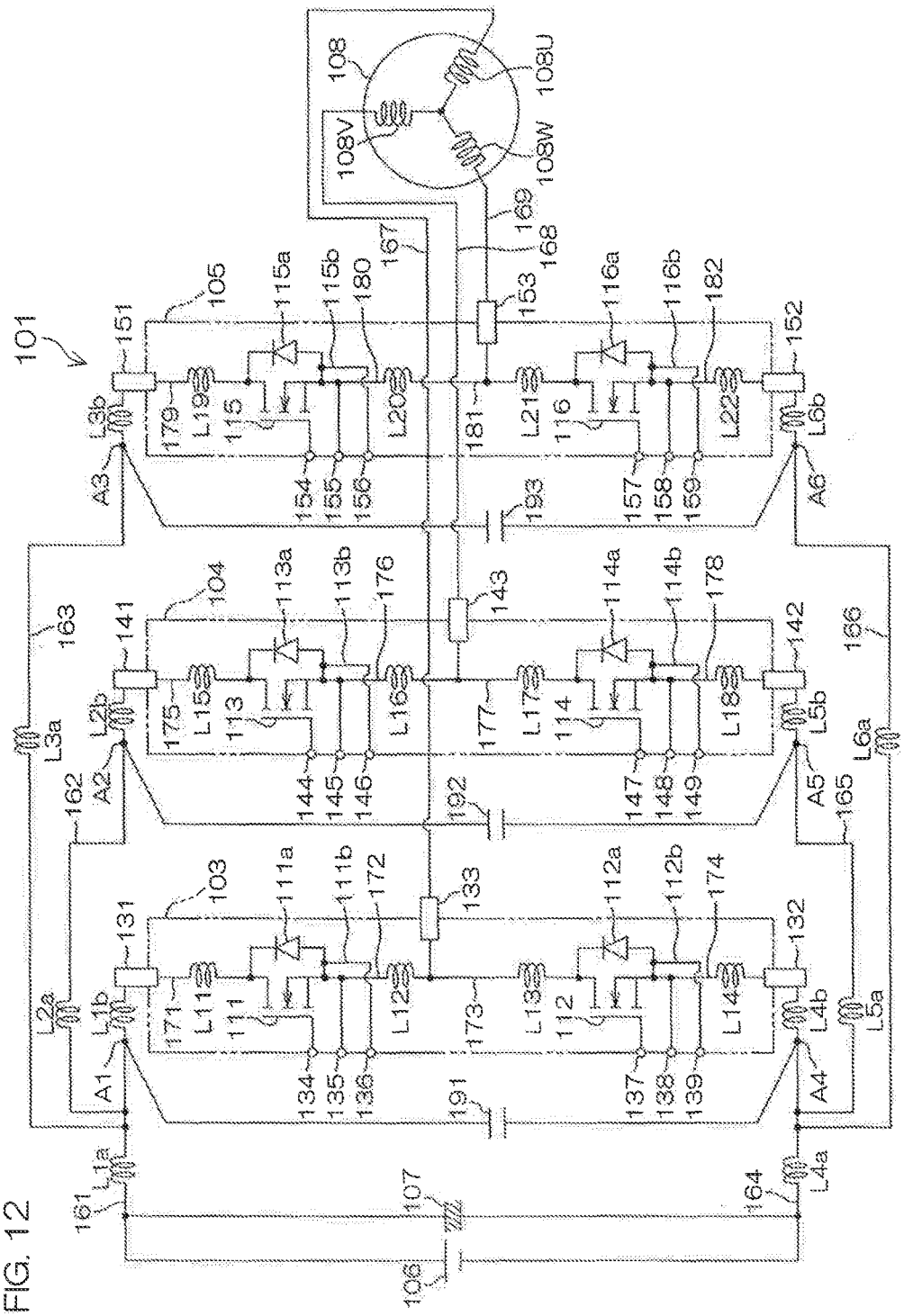
FIG. 12 is an electrical circuit diagram showing a three-phase inverter circuit.

FIG. 12 is an electrical circuit diagram showing a three-phase inverter circuit 101. The three-phase inverter circuit 101 is a circuit for driving a three-phase brushless motor 108 (hereinafter referred to as "electric motor"). The electric motor 108 includes a stator which includes a U-phase field winding 108U, a V-phase field winding 108V and a W-phase field winding 108W and a rotor to which a permanent magnet is fixed.

The three-phase inverter circuit 101 includes a U-phase module 103, a V-phase module 104 and a W-phase module 105. The U-phase module 103 includes a first power supply terminal (P terminal) 131, a second power supply terminal (N terminal) 132, an output terminal (OUT terminal) 133, two gate terminals 134 and 137, two source terminals 135 and 138 and two source sense terminals 136 and 139.

The V-phase module 104 includes a first power supply terminal (P terminal) 141, a second power supply terminal (N terminal) 142, an output terminal (OUT terminal) 143, two gate terminals 144 and 147, two source terminals 145 and 148 and two source sense terminals 146 and 149. The W-phase module 105 includes a first power supply terminal (P terminal) 151, a second power supply terminal (N terminal) 152, an output terminal (OUT terminal) 153, two gate terminals 154 and 157, two source terminals 155 and 158 and two source sense terminals 156 and 159.

The first power supply terminals 131, 141 and 151 of the modules 103, 104 and 105 are connected via external wires to the positive terminal of a power supply 106 (direct-current power supply). Specifically, the first power supply terminal 131 of the U-phase module 103 is connected to the positive terminal of the power supply 106 via the first external wire 161. The first power supply terminal 141 of the V-phase module 104 is connected to the intermediate portion of the first external wire 161 via the second external wire 162. The first power supply terminal 151 of the W-phase module 105 is connected to the intermediate portion of the first external wire 161 via the third external wire 163.

The second power supply terminals 132, 142 and 152 of the modules 103, 104 and 105 are connected to the negative terminal of the power supply 106 via external wires. Specifically, the second power supply terminal 132 of the U-phase module 103 is connected to the negative terminal of the power supply 106 through the fourth external wire 164. The second power supply terminal 142 of the V-phase module 104 is connected to the intermediate portion of the fourth external wire 164 via the fifth external wire 165. The second power supply terminal 152 of the W-phase module 105 is connected to the intermediate portion of the fourth external wire 164 via the sixth external wire 166. An inductance parasitizes each of the external wires 161 to 166.

A smoothing capacitor 107 is connected in parallel to the power supply 106. The output terminals 133, 143 and 153 of the modules 103 104 and 105 are respectively connected to the U-phase field winding 108U, the V-phase field winding 108V and the W-phase field winding 108W of the electric motor 108 via seventh, eighth and ninth external wires 167, 168 and 169. An unillustrated control unit is connected to the gate terminals 134, 137, 144, 147, 154 and 157 and the source sense terminals 136, 139, 146, 149, 156 and 159 in the modules 103, 104 and 105. A gate drive signal is supplied by the control unit via unillustrated gate resistors to the gate terminals 134, 137, 144, 147, 154 and 157 in the modules 103, 104 and 105.

The U-phase module 103 includes a high-side first MOSFET 111 and a low-side second MOSFET 112 which is connected in series to the high-side fifth MOSFET 111. The MOSFETs 111 and 112 incorporate a first pn diode (body diode) 111a and a second pn diode 112a, respectively. The pn diodes 111a and 112a are the pn diode 1 described previously. The anodes of the pn diodes 111a and 112a are electrically connected to the sources of the corresponding MOSFETs 111 and 112, and the cathodes thereof are electrically connected to the drains of the corresponding MOSFETs 111 and 112. The MOSFETs 111 and 112 include current detecting portions 111b and 112b, respectively.

The drain of the first MOSFET 111 is connected via a connection metallic member 171 to the first power supply terminal 131 of the U-phase module 103. The source of the first MOSFET 111 is connected via a connection metallic member 172 to the output terminal 133 of the U-phase module 103. Inductances L11 and L12 parasitize the connection metallic members 171 and 172, respectively. The source of the first MOSFET 111 is further connected to the source terminal 135 of the U-phase module 103. The current detecting portion 111b is connected to the source sense terminal 136 of the U-phase module 103. The gate of the first MOSFET 111 is connected to the gate terminal 134 of the U-phase module 103.

The drain of the second MOSFET 112 is connected via a connection metallic member 173 to the output terminal 133 of the U-phase module 103. The source of the second MOSFET 112 is connected via a connection metallic member 174 to the second power supply terminal 132 of the U-phase module 103. Inductances L13 and L14 parasitize the connection metallic members 173 and 174, respectively.

The source of the second MOSFET 112 is further connected to the source terminal 138 of the U-phase module 103. The current detecting portion 112b is connected to the source sense terminal 139 of the U-phase module 103. The gate of the second MOSFET 112 is connected to the gate terminal 137 of the U-phase module 103.

The V-phase module 104 includes a high-side third MOSFET 113 and a low-side fourth MOSFET 114 which is connected the high-side fifth MOSFET 113. The MOSFETs 113 and 114 incorporate third and fourth pn diodes (body diodes) 113a and 114a, respectively. The pn diodes 113a and 114a are the pn diode 1 described previously. The anodes of the pn diodes 113a and 114a are electrically connected to the sources of the corresponding MOSFETs 113 and 114, and the cathodes thereof are electrically connected to the drains of the corresponding MOSFETs 113 and 114. The MOSFETs 113 and 114 include current detecting portions 113b and 114b, respectively.

The drain of the third MOSFET 113 is connected via a connection metallic member 175 to the first power supply terminal 141 of the V-phase module 104. The source of the third MOSFET 113 is connected via a connection metallic member 176 to the output terminal 143 of the V-phase module 104. Inductances L15 and L16 parasitize the connection metallic members 175 and 176, respectively. The source of the third MOSFET 113 is further connected to the source terminal 145 of the V-phase module 104. The current detecting portion 113b is connected to the source sense terminal 146 of the V-phase module 104. The gate of the third MOSFET 113 is connected to the gate terminal 144 of the V-phase module 104.

The drain of the fourth MOSFET 114 is connected via a connection metallic member 177 to the output terminal 143 of the V-phase module 104. The source of the fourth MOSFET 114 is connected via a connection metallic member 178 to the second power supply terminal 142 of the V-phase module 104. Inductances L17 and L18 parasitize the connection metallic members 177 and 178, respectively. The source of the fourth MOSFET 114 is further connected to the source terminal 148 of the V-phase module 104. The current detecting portion 114b is connected to the source sense terminal 149 of the V-phase module 104. The gate of the fourth MOSFET 114 is connected to the gate terminal 147 of the V-phase module 104.

The W-phase module 105 includes a high-side fifth MOSFET 115 and a low-side sixth MOSFET 116 which is connected in series to the high-side fifth MOSFET 115. The MOSFETs 115 and 116 incorporate fifth and sixth pn diodes (body diodes) 115a and 116a, respectively. The pn diodes 115a and 116a are the pn diode 1 described previously. The anodes of the pn diodes 115a and 116a are electrically connected to the sources of the corresponding MOSFETs 115 and 116, and the cathodes thereof are electrically connected to the drains of the corresponding MOSFETs 115 and 116. The MOSFETs 115 and 116 include current detecting portions 115b and 116b, respectively.

The drain of the fifth MOSFET 115 is connected via a connection metallic member 179 to the first power supply terminal 151 of the W-phase module 105. The source of the fifth MOSFET 115 is connected via a connection metallic member 180 to the output terminal 153 of the W-phase module 105. Inductances L19 and L20 parasitize the connection metallic members 179 and 180, respectively. The source of the fifth MOSFET 115 is further connected to the source terminal 155 of the W-phase module 105. The current detecting portion 115b is connected to the source sense terminal 156 of the W-phase module 105. The gate of the fifth MOSFET 115 is connected to the gate terminal 154 of the W-phase module 105.

The drain of the sixth MOSFET 116 is connected via a connection metallic member 181 to the output terminal 153 of the W-phase module 105. The source of the sixth MOSFET 116 is connected via a connection metallic member 182 to the second power supply terminal 152 of the W-phase module 105. Inductances L21 and L22 parasitize the connection metallic members 181 and 182, respectively. The source of the sixth MOSFET 116 is further connected to the source terminal 158 of the W-phase module 105. The current detecting portion 116b is connected to the source sense terminal 159 of the W-phase module 105. The gate of the sixth MOSFET 116 is connected to the gate terminal 157 of the W-phase module 105.

The first to sixth MOSFETs 111 to 116 are SiC-MOSFETs such as an SiC-DMOSFET in which, for example, SiC (silicon carbide) that is an example of a compound semiconductor is used as a semiconductor material.

A snubber circuit formed with a capacitor 191 is connected between a portion of the first external wire 161 close to the first power supply terminal 131 of the U-phase module 103 and a portion of the fourth external wire 164 close to the second power supply terminal 132 of the U-phase module 103.

A connection point of the first external wire 161 and the capacitor 191 is referred to as a connection point A1. In a portion between the positive terminal of the power supply 106 in the first external wire 161 and the connection point A1, an inductance L1a parasitizes, and in a portion between the connection point A1 in the first external wire 161 and the first power supply terminal 131, an inductance L1b parasitizes. A connection point of the fourth external wire 164 and the capacitor 191 is referred to as a connection point A4. In a portion between the negative terminal of the power supply 106 in the fourth external wire 164 and the connection point A4, an inductance L4a parasitizes, and in a portion between the connection point A4 in the fourth external wire 164 and the second power supply terminal 132, an inductance L4b parasitizes.

A snubber circuit formed with a capacitor 192 is connected between a portion of the second external wire 162 close to the first power supply terminal 141 of the V-phase module 104 and a portion of the fifth external wire 165 close to the second power supply terminal 142 of the V-phase module 104.

A connection point of the second external wire 162 and the capacitor 192 is referred to as a connection point A2. In a portion between the connection point A2 in the second external wire 162 and the first power supply terminal 141, an inductance L2b parasitizes, and in the remaining portion, an inductance L2a parasitizes. A connection point of the fifth external wire 165 and the capacitor 192 is referred to as a connection point A5. In a portion between the connection point A5 in the fifth external wire 165 and the second power supply terminal 142, an inductance L5b parasitizes, and in the remaining portion, an inductance L5a parasitizes.

A snubber circuit formed with a capacitor 193 is connected between a portion of the third external wire 163 close to the first power supply terminal 151 of the W-phase module 105 and a portion of the sixth external wire 166 close to the second power supply terminal 152 of the W-phase module 105.

A connection point of the third external wire 162 and the capacitor 192 is referred to as a connection point A3. In a portion between the connection point A3 in the third external wire 163 and the first power supply terminal 151, an inductance L3b parasitizes, and in the remaining portion, an inductance L3a parasitizes. A connection point of the sixth external wire 166 and the capacitor 193 is referred to as a connection point A6. In a portion between the connection point A6 in the sixth external wire 166 and the second power supply terminal 152, an inductance L6b parasitizes, and in the remaining portion, an inductance L6a parasitizes. The capacitors (snubber circuits) 191 to 193 are provided in order to reduce a surge voltage.

Figure 13:
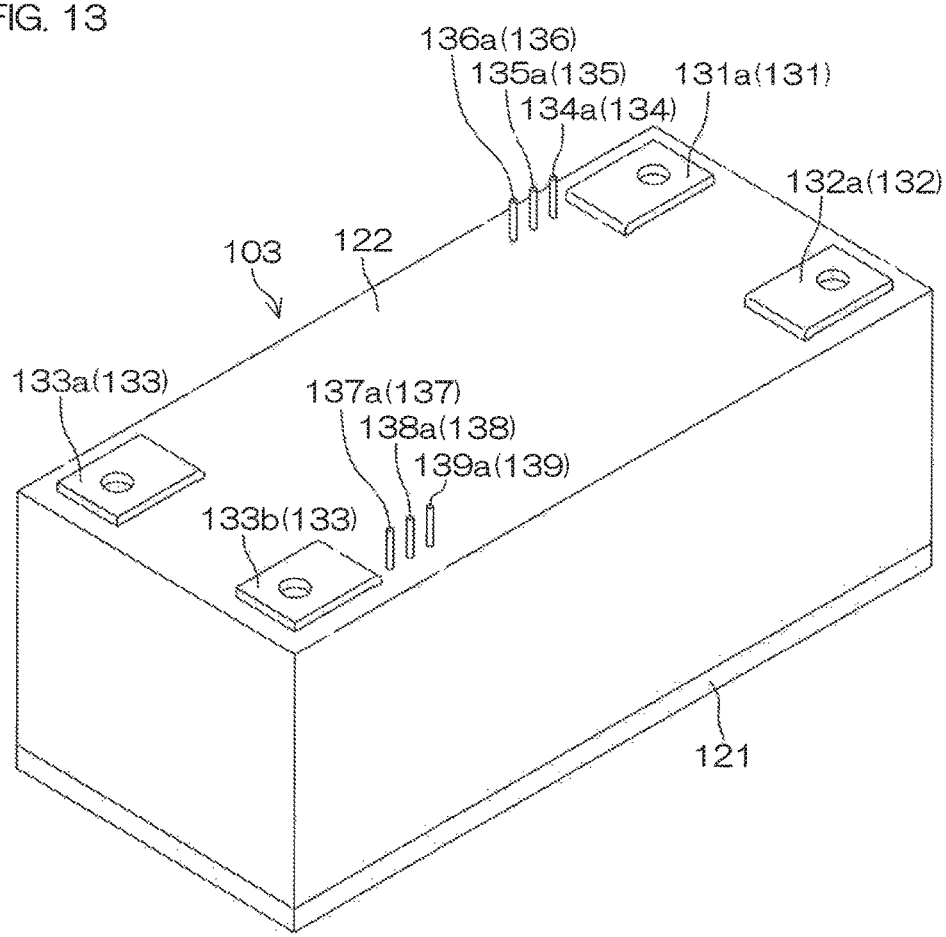
FIG. 13 is a schematic perspective view showing the appearance of a U-phase module in FIG. 12.

FIG. 13 is a schematic perspective view showing the appearance of the U-phase module 103 in FIG. 12.

The U-phase module 103 includes a heat dissipation plate 121, a substrate (unillustrated) which is fixed to the heat dissipation plate 121 and to which the base ends of the MOSFETs 111 and 112 and the terminals 131 to 139 and the like are fixed and a case 122 which is fixed to one surface of the heat dissipation plate 121 and which houses the substrate. The case 122 is formed substantially in the shape of a rectangle in plan view. The output terminal 133 of the module 103 is branched into two portions within the case 122 so as to have two flat plate-shaped branch portions. The tip end portions 133a and 133b of the branch portions penetrate the upper surface of the case 122 and are exposed to the outside of the case 122. The tip end portions 133a and 133b are arranged in both side portions of one end portion in the upper surface of the case 122 in a state where the tip end portions 133a and 133b are along the upper surface. The first power supply terminal 131 and the second power supply terminal 132 in the module 103 are formed in the shape of a flat plate, and the tip end portions 131a and 132a thereof penetrate the upper surface of the case 122 and are exposed to the outside of the case 122. The tip end portions 131a and 132b are arranged in both side portions of the other end portion in the upper surface of the case 122 in a state where the tip end portions 131a and 132b are along the upper surface.

The gate terminal 134, the source terminal 135 and the source sense terminal 136 on one side of the module 103 are formed in the shape of a rod, and the tip end portions 134a, 135a and 136a thereof penetrate the upper surface of the case 122 and are exposed to the outside of the case 122. The tip end portions 134a, 135a and 136a are arranged adjacent to the tip end portion 131a of the first power supply terminal 131 on the upper surface of the case 122. The gate terminal 137, the source terminal 138 and the source sense terminal 139 on the other side of the module 103 are formed in the shape of a rod, and the tip end portions 137a, 138a and 139a thereof penetrate the upper surface of the case 122 and are exposed to the outside of the case 122. The tip end portions 137a, 138a and 139a thereof are arranged adjacent to the tip end portion 133b of the output terminal 133 on the upper surface of the case 122.

Since the appearances and structures of the V-phase module 104 and the W-phase module 105 are the same as those of the U-phase module 103, the description thereof will be omitted.

Figure 14:
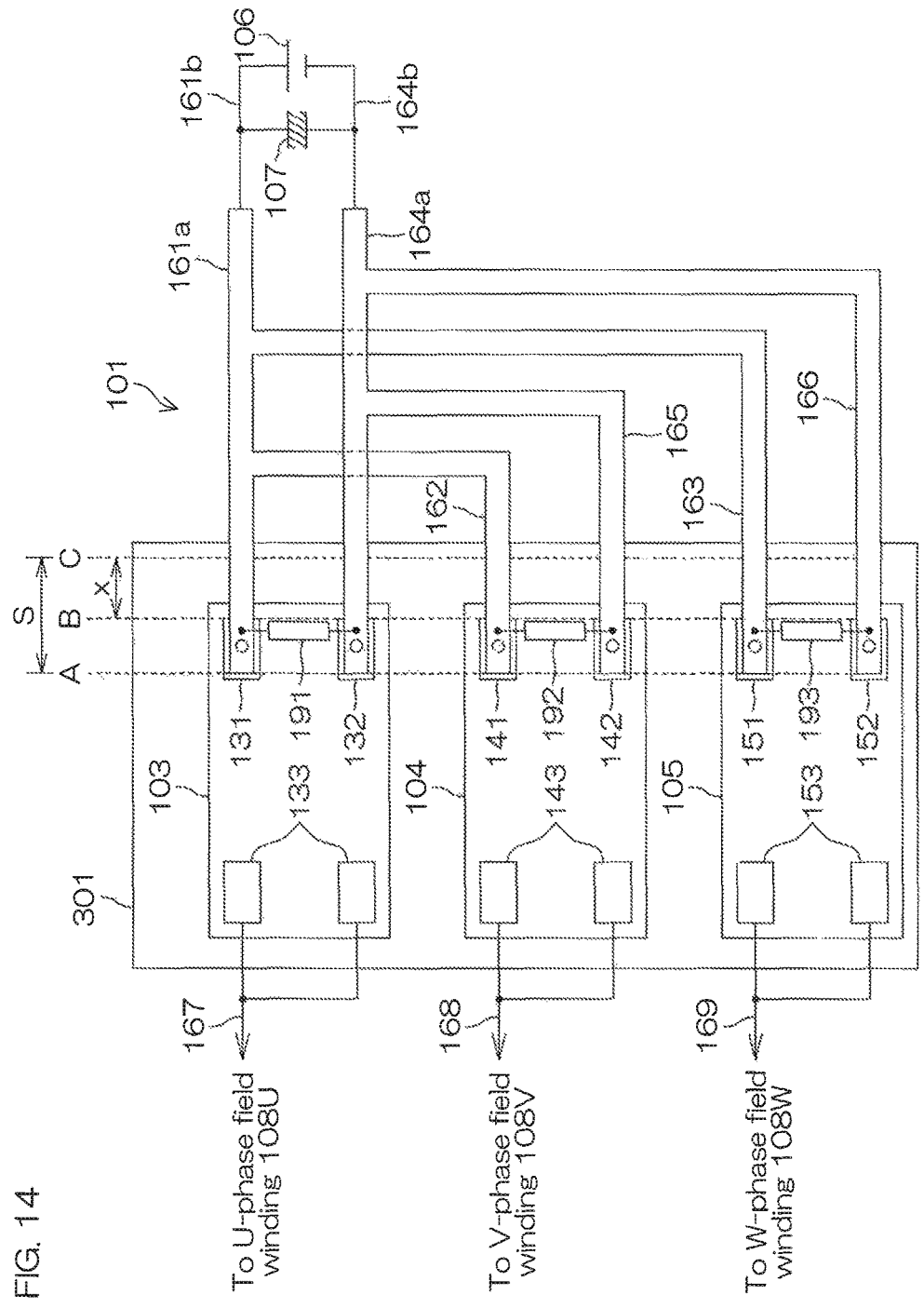
FIG. 14 is a plan view mainly showing external wires which are connected to the power supply terminals of modules and snubber circuits which are connected thereto.
Figure 15:
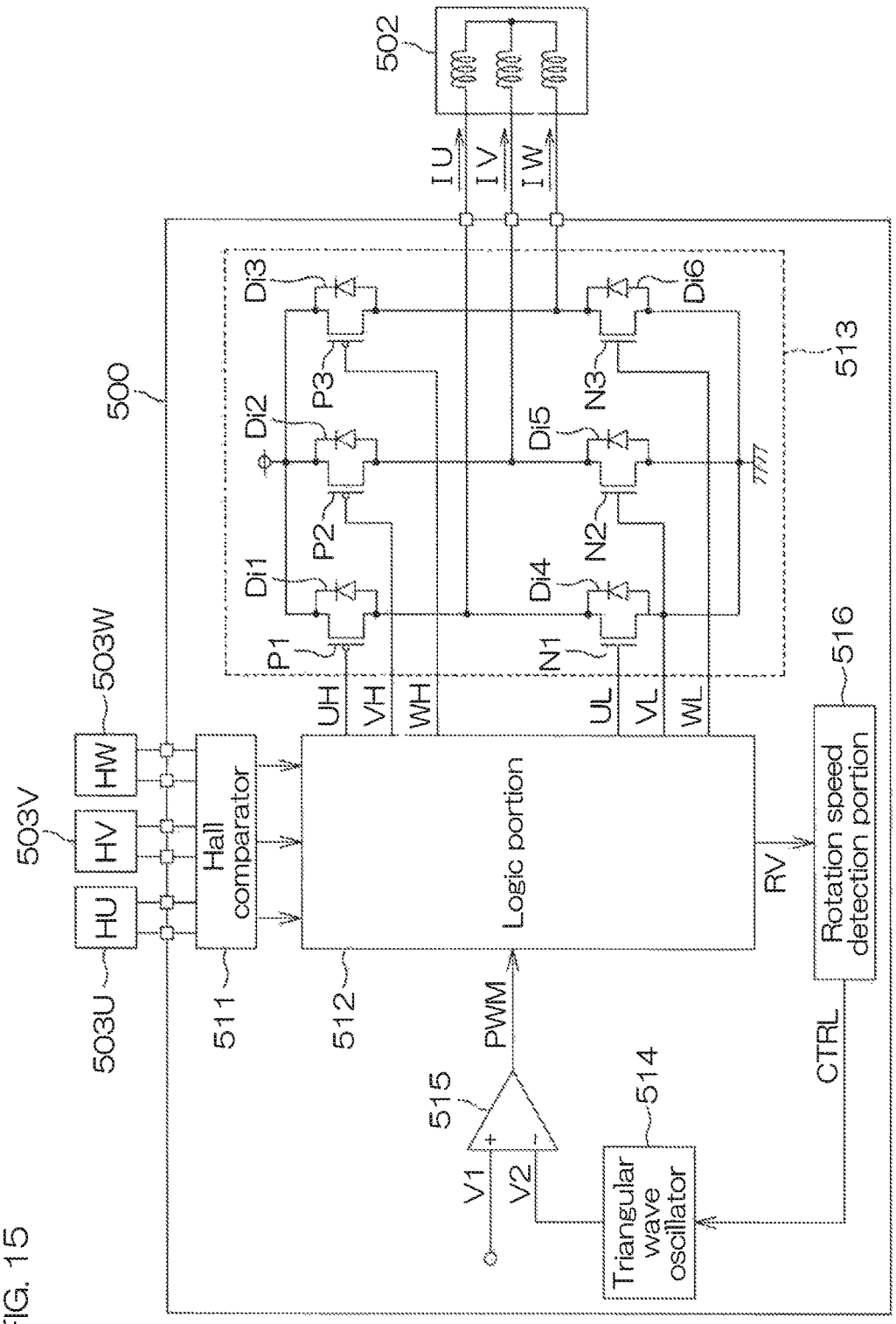
FIG. 15 is a block diagram (partially including a circuit diagram) of a motor drive device.

FIG. 14 is a plan view mainly showing the external wires which are connected to the power supply terminals 131, 132, 141, 142, 151 and 152 in the modules 102, 103 and 104 and the snubber circuits which are connected thereto.

The modules 103, 104 and 105 are attached to a cooling plate 301. The output terminal 133 of the U-phase module 103 is connected via the external wire 167 to the U-phase field winding 108U of the electric motor 108. The output terminal 143 of the V-phase module 104 is connected via the external wire 168 to the V-phase field winding 108V of the electric motor 108. The output terminal 153 of the W-phase module 105 is connected via the external wire 169 to the W-phase field winding 108W of the electric motor 108.

One end portion of a bus bar 161a is screwed to the first power supply terminal 131 of the U-phase module 103. The other end portion of the bus bar 161a is connected via a connection wire 161b to the positive terminal of the power supply 106. The bus bar 161a and the connection wire 161b form the first external wire 161 in FIG. 12. One end portion of a bus bar 164a is screwed to the second power supply terminal 131 of the U-phase module 103. The other end portion of the bus bar 164a is connected via a connection wire 164b to the negative terminal of the power supply 106. The bus bar 164a and the connection wire 164b form the fourth external wire 164 in FIG. 12. The smoothing capacitor 107 is connected in parallel to the power supply 106.

One end portion of a bus bar 162 (which corresponds to the second external wire 162 in FIG. 12) is screwed to the first power supply terminal 141 of the V-phase module 104. The other end portion of the bus bar 162 is connected to the intermediate portion of the bus bar 161a. One end portion of a bus bar 165 (which corresponds to the fifth external wire 165 in FIG. 12) is screwed to the second power supply terminal 142 of the V-phase module 104. The other end portion of the bus bar 165 is connected to the intermediate portion of the bus bar 164a.

One end portion of a bus bar 163 (which corresponds to the third external wire 163 in FIG. 12) is screwed to the first power supply terminal 151 of the W-phase module 105. The other end portion of the bus bar 163 is connected to the intermediate portion of the bus bar 161a. One end portion of a bus bar 166 (which corresponds to the sixth external wire 166 in FIG. 12) is screwed to the second power supply terminal 162 of the W-phase module 105. The other end portion of the bus bar 166 is connected to the intermediate portion of the bus bar 164a.

The capacitor 191 is connected between a portion of the bus bar 161a close to the first power supply terminal 131 and a portion of the bus bar 164a close to the second power supply terminal 132. The capacitor 192 is connected between a portion of the bus bar 162 close to the first power supply terminal 141 and a portion of the bus bar 165 close to the second power supply terminal 142. The capacitor 193 is connected between a portion of the bus bar 163 close to the first power supply terminal 151 and a portion of the bus bar 166 close to the second power supply terminal 152.

One ends of the capacitors 191, 192 and 193 are preferably connected between one ends (positions A) of the corresponding bus bars 161a, 162 and 163 on the sides of the first power supply terminals 131, 141 and 151 and positions (positions C) which are separated by a predetermined distance x in a direction away from the first power supply terminals 131, 141 and 151 with respect to the positions (positions B) of the corresponding bus bars 161a, 162 and 163 closest to the outer ends of the first power supply terminals 131, 141 and 151 (region S between A and C).

Likewise, the other ends of the capacitors 191, 192 and 193 are preferably connected between one ends (positions A) of the corresponding bus bars 164a, 165 and 166 on the sides of the second power supply terminals 132, 142 and 152 and positions (positions C) which are separated by the predetermined distance x in a direction away from the second power supply terminals 132, 142 and 152 with respect to the positions (positions B) of the corresponding bus bars 164a, 165 and 166 closest to the outer ends of the second power supply terminals 132, 142 and 152 (region S between A and C).

The predetermined distance x is preferably set to such a distance that the inductances of the portions of the bus bars 161a, 162, 163, 164a, 165 and 166 from the positions B to the positions C are equal to or less than 6.25 (nH). The x is set as described above, and thus, as will be described later, it is possible to reduce a switching loss and a surge voltage applied to the MOSFET when the MOSFET is turned off.

The two bus bars 161a and 164a connected to the two power supply terminals 131 and 132 in the module 103 are preferably arranged such that the inductance components thereof are offset and that the intermediate portions thereof vertically overlap each other in plan view. Likewise, the two bus bars 163 and 166 connected to the two power supply terminals 151 and 152 in the module 104 are preferably arranged such that the intermediate portions thereof vertically overlap each other in plan view.

With reference back to FIG. 12, when among the MOSFETs 111 to 116, for example, the high-side MOSFET 111 within the U-phase module 103 and the low-side MOSFET 114 within the V-phase module 104 are turned on, a current flows from the positive terminal of the power supply 106 to the negative terminal of the power supply 106 through the first external wire 161, the first power supply terminal 131, the connection metallic member 171, the MOSFET 111, the connection metallic member 172, the output terminal 133, the seventh external wire 167, the U-phase field winding 108U and the V-phase field winding 108V of the electric motor 108, the eighth external wire 168, the output terminal 143, the connection metallic member 177, the MOSFET 114, the connection metallic member 178, the second power supply terminal 142, the fifth external wire 165 and the fourth external wire 164.

When in this state, the high-side MOSFET 111 within the U-phase module 103 is turned off, a load current flows back through a closed circuit which includes the output terminal 133, the seventh external wire 167, the U-phase field winding 108U and the V-phase field winding 108V of the electric motor 108, the eighth external wire 168, the output terminal 143, the connection metallic member 177, the MOSFET 114, the connection metallic member 178, the second power supply terminal 142, the fifth external wire 165, a portion between the connection point of the fourth external wire 164 and the fifth external wire 165 and the second output terminal 132, the second output terminal 132, the connection metallic member 174, the pn diode 112a and the connection metallic member 173.

In this case, a current change rate (di/dt) of a drain current for the MOSFET 111 and a surge voltage (Ls·di/dt) caused by a predetermined parasitic inductance Ls of a circuit wire are applied to the MOSFET 111.

When the snubber circuits 191 to 193 are not provided, an inductance Lst which causes the occurrence of the surge voltage applied to the MOSFET 111 is the sum of an inductance (part of L4a) between the connection point of the fourth external wire 164 and the fifth external wire 165 and the negative terminal of the power supply 106, the inductance (L1a+L1b) of the first external wire 161, the inductances L11 and L12 of the connection metallic members 171 and 172, an inductance (sum of part of L4a and L4b) between the connection point of the fourth external wire 164 and the fifth external wire 165 and the second power supply terminal 132 and the inductances L13 and L14 of the connection metallic members 173 and 174.

In the preferred embodiment, since the snubber circuits 191 to 193 are provided, energy accumulated in the inductance L4a of the portion between the connection point A4 in the fourth external wire 164 and the negative terminal of the power supply 106 and the inductance L1a of the portion between the positive terminal of the power supply 106 in the first external wire 161 and the connection point A1 is absorbed by the capacitor 191. Consequently, an inductance Lsn which causes the occurrence of the surge voltage applied to the MOSFET 111 is the sum of the inductance L1b of the portion between the connection point A1 in the first external wire 161 and the first power supply terminal 131, the inductances L11, L12, L13 and L14 of the connection metallic members 171, 172, 173 and 174 and the inductance L4b of the portion between the connection point A4 in the fourth external wire 164 and the second power supply terminal 131. In other words, the inductance Lsn which causes the occurrence of the surge voltage applied to the MOSFET 111 is significantly reduced as compared with the inductance Lst when the snubber circuits 191 to 193 are not provided. Hence, the surge voltage applied to the MOSFET 111 is significantly reduced as compared with the case where the snubber circuits 191 to 193 are not provided.

When in a state where the MOSFETs 111 and 114 are turned on, for example, the low-side MOSFET 114 within the V-phase module 104 is turned off, a load current flows back through a closed circuit which includes the first power supply terminal 131, the connection metallic member 171, the MOSFET 111, the connection metallic member 172, the output terminal 133, the seventh external wire 167, the U-phase field winding 108U and the V-phase field winding 108V of the electric motor 108, the eighth external wire 168, the output terminal 143, the connection metallic member 176, the pn diode 113a, the connection metallic member 175, the first power supply terminal 141, the second external wire 162 and a portion between the connection point of the second external wire 162 in the first external wire 161 and the first power supply terminal 131.

In this case, a current change rate (di/dt) of a drain current for the MOSFET 114 and the surge voltage (Ls·di/dt) caused by the predetermined parasitic inductance Ls of the circuit wire are applied to the MOSFET 114.

When the snubber circuits 191 to 193 are not provided, the inductance Lst which causes the occurrence of the surge voltage applied to the MOSFET 114 is the sum of an inductance (part of L1a) between the connection point of the positive terminal of the power supply 106 in the first external wire 161 and the second wire 162, the inductances L17 and L18 of the connection metallic members 177 and 178, the inductance (L5a+L5b) of the fifth external wire 165, an inductance (part of L4a) of a portion between the connection point of the fifth external wire 165 in the fourth external wire 164 and the negative terminal of the power supply 106, the inductance (L2a+L2b) of the second external portion wire member 162 and the inductances L15 and L16 of the connection metallic members 175 and 176.

In the preferred embodiment, since the snubber circuits 191 to 193 are provided, energy accumulated in the inductance (part of L1a) between the connection point of the positive terminal of the power supply 106 in the first external wire 161 and the second wire 162, the inductance L5a of the portion between the connection point A5 in the fifth external wire 165 and the connection point of the fourth external wire 164, the inductance (part of L4a) of the portion between the connection point of the fifth external wire 165 in the fourth external wire 164 and the negative terminal of the power supply 106 and the inductance L2a of the portion between the connection point of the first external wire 161 in the second external wire 162 and the connection point A2 is absorbed by the capacitor 192. Consequently, the inductance Lsn which causes the occurrence of the surge voltage applied to the MOSFET 114 is the sum of the inductance L2b of the portion between the connection point A2 in the second external wire 162 and the first power supply terminal 141, the inductances L15, L16, L17 and L18 of the connection metallic members 175, 176, 177 and 178 and the inductance L5b of the portion between the connection point A5 of the second power supply terminal 142 in the fifth external wire 165 and the connection point A5. In other words, the inductance Lsn which causes the occurrence of the surge voltage applied to the MOSFET 114 is significantly reduced as compared with the inductance Lst when the snubber circuits 191 to 193 are not provided. Hence, the surge voltage applied to the MOSFET 114 is significantly reduced as compared with the case where the snubber circuits 191 to 193 are not provided.

When, in a state where the MOSFETs 111 and 114 are turned on, both the MOSFETs 111 and 114 are turned off simultaneously, a load current flows, in a direction extending from the fourth external wire 164 to the first external wire 161, through the fourth external wire 164, the second power supply terminal 132, the connection metallic member 174, the pn diode 112a, the connection metallic member 173, the output terminal 133, the seventh external wire 167, the U-phase field winding 108U and the V-phase field winding 108V of the electric motor 108, the eighth external wire 168, the output terminal 143, the connection metallic member 176, the pn diode 113a, the connection metallic member 175, the first power supply terminal 141, the second external wire 162 and a portion between the connection point of the second external wire 162 in the first external wire 161 and the positive terminal of the power supply 106.

In this case, most of the energy accumulated in the inductance parasitized by the external wire is absorbed by the capacitors 191 and 192. Hence, the inductance Lsn which causes the occurrence of the surge voltage applied to the MOSFET 111 is the sum of L1b, L11 and L12 (internal inductance within the U-phase module 103) and L4b. On the other hand, the inductance Lsn which causes the occurrence of the surge voltage applied to the MOSFET 111 is the sum of L2b, L15 to L18 (internal inductance within the V-phase module 104) and L5b.

In other words, when any one of the MOSFETs 111 and 112 within the U-phase module 103 is turned off, the inductance Lsn which causes the occurrence of the surge voltage applied to the MOSFET (hereinafter also referred to as "$Lsn_U$") is the sum of L1b and L11 and L12 (the internal inductance within the U-phase module 103) and L4b.

When any one of the MOSFETs 113 and 114 within the V-phase module 104 is turned off, the inductance Lsn which causes the occurrence of the surge voltage applied to the MOSFET (hereinafter also referred to as "$Lsn_V$") is the sum of L2b and L15 to L18 (the internal inductance within the V-phase module 104) and L5b.

When any one of the MOSFETs 115 and 116 within the W-phase module 105 is turned off, the inductance Lsn which causes the occurrence of the surge voltage applied to the MOSFET (hereinafter also referred to as "$Lsn_W$") is the sum of L3b and L19 to L22 (the internal inductance within the W-phase module 105) and L6b. In the preferred embodiment, $Lsn_U$, $Lsn_V$ and $Lsn_W$ are substantially equal to each other. $Lsn_U$, $Lsn_V$ and $Lsn_W$ are preferably equal to or less than 40 (nH) as will be described later.

When, in the three-phase inverter circuit 101, the connection positions to the bus bars corresponding to the capacitors 191 to 193 are changed, and thus a gate resistance for the MOSFET is changed such that the surge voltage applied to the MOSFET which is turned off becomes constant, as the inductance Lsn (other than the inductances whose stored energy is absorbed by the snubber circuits 191 to 193) which causes the occurrence of the surge voltage applied to the MOSFET is decreased, the change rate di/dt of the drain current for the MOSFET is increased (di rises more rapidly), with the result that a switching loss when the MOSFET is turned off is decreased. Hence, the inductance Lsn which causes the occurrence of the surge voltage is decreased, and thus it is possible to reduce the switching loss when the MOSFET is turned off and to reduce the surge voltage.

In the preferred embodiment, since one ends of the capacitors 191, 192 and 193 are connected to the positions of the external wires 161, 162 and 163 closest to the first power supply terminals 131, 141 and 151, it is possible to decrease the inductances L1b, L2b and L3b of the external wire portions between one ends of the snubber circuits 191, 192 and 193 and the first power supply terminals 131, 141 and 151. Moreover, since the other ends of the capacitors 191, 192 and 193 are connected to the positions of the external wires 164, 165 and 166 closest to the second power supply terminals 132, 142 and 152, it is possible to decrease the inductances L4b, L5b and L6b of the external wire portions between the other ends of the snubber circuits 191, 192 and 193 and the second power supply terminals 132, 142 and 152.

Thus, it is possible to decrease the inductance Lsn which causes, when an arbitrary MOSFET is turned off, the occurrence of the surge voltage applied to the MOSFET. In this way, thus it is possible to reduce the switching loss when the MOSFET is turned off and to reduce the surge voltage.

A relationship between the inductance Lsn which causes the occurrence of the surge voltage applied to the MOSFET that is turned off and the switching loss when the MOSFET is turned off and the change rate di/dt of the drain current will next be described.

A plurality of samples a to g which have different inductances Lsn are prepared. Specifically, the distance from one ends of the bus bars 161a, 164a, 162, 165, 163 and 166 on the sides of the power supply terminals 131, 132, 141, 142, 151 and 152 to the connection positions to the capacitors 191 to 193 is changed, and thus the samples a to g which have different inductances Lsn are prepared.

The distance from the one ends of the bus bars 161a, 164a, 162, 165, 163 and 166 on the sides of the power supply terminals 131, 132, 141, 142, 151 and 152 to the connection positions to the capacitors 191 to 193 is set such that the distance in the sample a is shortest and that the distance is increased in the order of a, b, c, d, e, f and g.

In the sample a, as shown in FIG. 14, both ends of the capacitors 191 to 193 are connected between the one ends (position A) of the corresponding bus bars 161a, 164a, 162, 165, 163 and 166 on the sides of the power supply terminals 131, 132, 141, 142, 151 and 152 and the position (position B) corresponding to the outer ends of the power supply terminals 131, 132, 141, 142, 151 and 152 (between A-B). In the samples b to g, both ends of the capacitors 191 to 193 are connected to positions away from the power supply terminals 131, 132, 141, 142, 151 and 152 as compared with the position (position B) corresponding to the outer ends of the power supply terminals 131, 132, 141, 142, 151 and 152 in the corresponding bus bars 161a, 164a, 162, 165, 163 and 166.

Hence, the inductances L1b, L4b, L2b, L5b, L3b and L5b are increased in the order of a, b, c, d, e, f and g. Thus, the inductance Lsn which causes the occurrence of the surge voltage applied to the MOSFET that is turned off is increased in the order of a, b, c, d, e, f and g.

In the samples a to g, in a state where the MOSFETs 111 and 114 are turned on, the MOSFET 111 is turned off, and thus a gate resistance is adjusted such that the surge voltage (Lsn·di/dt) applied to the MOSFET 111 when the MOSFET 111 is turned off is a predetermined value. After the gate resistance is adjusted such that the surge voltage is the predetermined value, in the state where the MOSFETs 111 and 114 are turned on, the MOSFET 111 is turned off, and the switching loss (mJ) when the MOSFET 111 is turned off and the change rate di/dt (A/ns) of the drain current in the MOSFET 111 are measured. In this case, the inductance Lsn which causes the occurrence of the surge voltage applied to the MOSFET 111 is $Lsn_U$ (=L1b+L4b+L11+L12+L13+L14).

As described above, more specifically, the preferred embodiment of the present invention is particularly effective in an application in which in the high-speed diode (fast recovery diode) 11, as the operation condition of the diode, a high-speed operation of diF/dt=2500 A/μs or more is required. This is because at a response speed which is equal to or less than this speed, switching noise caused by the depletion of carriers is prevented from becoming a major problem.

The present invention is particularly effective when a forward current density at the time of operation is equal to or less than 1 A/mm².

In an application in which the guaranteed withstand voltage is equal to or more than 600V, the effect of reducing a surge voltage in the present invention is particularly effective.

In the present invention, various modifications are possible within the scope of the appended claims.

What is claimed is:

1. A high-speed diode comprising:
an n-type semiconductor layer; and
a p-type semiconductor layer which is laminated on the n-type semiconductor layer,
wherein a pn junction is formed in a boundary portion between the n-type semiconductor layer and the p-type semiconductor layer,
crystal defects are formed away from the p-type semiconductor layer and such that a frequency of appearance is gradually decreased from an upper surface of the p-type semiconductor layer toward a bottom surface of the n-type semiconductor layer,
the high-speed diode has a profile of a positive hole concentration distribution when having a low current in which a forward current density is equal to or less than 1 A/mm²,
the profile includes an inflection point spaced apart from a surface of the p-type semiconductor layer, and
a positive hole concentration of the profile decreases from the surface of the p-type semiconductor layer towards the inflection point and increases from the inflection point towards the bottom surface of n-type semiconductor layer.

2. The high-speed diode according to claim 1,
wherein the n-type semiconductor layer includes a high concentration n-type semiconductor substrate and a low concentration n-type semiconductor layer which is laminated on an upper surface of the high concentration n-type semiconductor substrate by epitaxial growth, and
the pn junction is formed in a boundary portion between the low concentration n-type semiconductor layer and the p-type semiconductor layer.

3. The high-speed diode according to claim 2,
wherein a cathode electrode is connected to a lower surface of the high concentration n-type semiconductor substrate, and an anode electrode is connected to the upper surface of the p-type semiconductor layer.

4. A method of manufacturing the high-speed diode according to claim 1, the method comprising:
a step of preparing a semiconductor wafer in which a pn junction is formed; and
a step of irradiating an electron beam by a predetermined acceleration voltage from a front surface of the semiconductor wafer on a position in which the pn junction is formed toward the pn junction portion, wherein
the electron beam is irradiated to the semiconductor wafer such that a relative dose is decreased with increasing a distance in a depth direction from an upper surface of the wafer by interposing a predetermined absorber between an output portion for the electron beam and the front surface of the semiconductor wafer receiving the irradiation of the electron beam in the step of irradiating an electron beam.

5. The method of manufacturing the high-speed diode according to claim 4,
wherein the predetermined absorber is a semiconductor wafer which is separate from a target to be processed.

6. The high-speed diode according to claim 1, wherein the crystal defects are disposed in a region of the n-type semiconductor layer between the p-type semiconductor layer and the bottom surface of the n-type semiconductor layer.

* * * * *